US012106698B2

(12) United States Patent
Su et al.

(10) Patent No.: US 12,106,698 B2
(45) Date of Patent: Oct. 1, 2024

(54) DISPLAY PANEL AND TERMINAL DEVICE HAVING DRIVE CHIP FOR WHICH SEQUENCE OF INPUT DISPLAY DATA IS CHANGED

(71) Applicant: Honor Device Co., Ltd., Shenzhen (CN)

(72) Inventors: Yi Su, Shenzhen (CN); Yabin An, Shenzhen (CN); Haiming He, Shenzhen (CN)

(73) Assignee: HONOR DEVICE CO., LTD., Shenzhen (CN)

( * ) Notice: Subject to any disclaimer, the term of this patent is extended or adjusted under 35 U.S.C. 154(b) by 0 days.

(21) Appl. No.: 17/918,029

(22) PCT Filed: May 16, 2022

(86) PCT No.: PCT/CN2022/093175
§ 371 (c)(1),
(2) Date: Oct. 10, 2022

(87) PCT Pub. No.: WO2023/005360
PCT Pub. Date: Feb. 2, 2023

(65) Prior Publication Data
US 2024/0127734 A1    Apr. 18, 2024

(30) Foreign Application Priority Data

Jul. 28, 2021   (CN) .......................... 202110860293.0
Sep. 30, 2021   (CN) .......................... 202111159146.7

(51) Int. Cl.
*G09G 3/20*     (2006.01)

(52) U.S. Cl.
CPC ..... *G09G 3/2096* (2013.01); *G09G 2320/0223* (2013.01); *G09G 2320/0233* (2013.01)

(58) Field of Classification Search
CPC ......... G09G 3/2096; G09G 2320/0223; G09G 2320/0233
See application file for complete search history.

(56) References Cited

U.S. PATENT DOCUMENTS

| 7,511,691 B2 | 3/2009 | Hirayama et al. |
| 7,750,883 B2 | 7/2010 | Moon et al. |

(Continued)

FOREIGN PATENT DOCUMENTS

| CN | 1123429 A | 5/1996 |
| CN | 1641728 A | 7/2005 |

(Continued)

*Primary Examiner* — Kwang-Su Yang
(74) *Attorney, Agent, or Firm* — Conley Rose, P.C.

(57) ABSTRACT

Embodiments of this application provide a display panel and a terminal device, and are applied to the field of terminal technologies. The display panel is provided with a connection line, a signal line in an edge display area is extended to a center display area through the connection line and connected to a fan-out lead, and a sequence of input first display data is changed by using a drive chip, so that when an arrangement number of each fan-out lead is different from an arrangement number of a signal line connected to the fan-out lead, second display data output by the drive chip can be transmitted to a correct signal line. In addition, a same drive chip can be applied to different terminal devices, to improve utilization of the drive chip and reduce design costs of the drive chip.

20 Claims, 10 Drawing Sheets

(56) References Cited

U.S. PATENT DOCUMENTS

| | | |
|---|---|---|
| 10,629,152 B2 | 4/2020 | Yokoyama et al. |
| 10,680,048 B2 | 6/2020 | Li |
| 10,761,386 B2 | 9/2020 | Zhang et al. |
| 10,984,697 B2 | 4/2021 | Chien et al. |
| 11,069,302 B2 | 7/2021 | Lee |
| 11,158,267 B2 | 10/2021 | Jeong et al. |
| 11,217,144 B2 | 1/2022 | Ahn et al. |
| 2018/0047355 A1 | 2/2018 | Hsu et al. |
| 2019/0115368 A1 | 4/2019 | Li |
| 2020/0387253 A1 | 12/2020 | Shi |
| 2020/0394967 A1* | 12/2020 | Park .................. G06F 1/1626 |
| 2021/0074202 A1 | 3/2021 | Kim et al. |
| 2021/0151470 A1* | 5/2021 | Cho .................. H01L 23/585 |
| 2023/0377506 A1* | 11/2023 | Su .................. G09G 3/2096 |

FOREIGN PATENT DOCUMENTS

| | | |
|---|---|---|
| CN | 101093299 A | 12/2007 |
| CN | 105161068 A | 12/2015 |
| CN | 105958811 A | 9/2016 |
| CN | 107065336 A | 8/2017 |
| CN | 107632477 A | 1/2018 |
| CN | 107765482 A | 3/2018 |
| CN | 108254984 A | 7/2018 |
| CN | 108417181 A | 8/2018 |
| CN | 109445210 A | 3/2019 |
| CN | 109493824 A | 3/2019 |
| CN | 109686327 A | 4/2019 |
| CN | 109791745 A | 5/2019 |
| CN | 111033455 A | 4/2020 |
| CN | 111445806 A | 7/2020 |
| CN | 111508446 A | 8/2020 |
| CN | 111755476 A | 10/2020 |
| CN | 112051691 A | 12/2020 |
| CN | 112054038 A | 12/2020 |
| CN | 112310150 A | 2/2021 |
| CN | 112785976 A | 5/2021 |
| CN | 112825234 A | 5/2021 |
| CN | 114093275 A | 2/2022 |

\* cited by examiner

DISPLAY PANEL AND TERMINAL DEVICE HAVING DRIVE CHIP FOR WHICH SEQUENCE OF INPUT DISPLAY DATA IS CHANGED

CROSS-REFERENCE TO RELATED APPLICATIONS

This application is a U.S. National Stage of International Application No. PCT/CN2022/093175 filed on May 16, 2022, which claims priority to Chinese Patent Application No. 202110860293.0, filed with the China National Intellectual Property Administration on Jul. 28, 2021, and claims priority to Chinese Patent Application No. 202111159146.7, filed with the China National Intellectual Property Administration on Sep. 30, 2021, all of which are incorporated herein by reference in their entireties.

TECHNICAL FIELD

This application relates to the field of terminal technologies, and in particular, to a display panel and a terminal device.

BACKGROUND

With continuous development of information age, terminal devices such as mobile phones have become commonly used tools in people's life and work, and terminal devices with a high screen-to-body ratio are favored by increasingly more consumers, so that the terminal devices with the high screen-to-body ratio gradually become the trend of the industry.

SUMMARY

Embodiments of this application provide a display panel and a terminal device, so that a sequence of input first display data is changed by a drive chip while reducing a width of a bezel on a side on which the display panel is bound to the drive chip, and therefore each piece of second display data obtained through the change can be transmitted to a correct signal line.

According to a first aspect, an embodiment of this application provides a display panel. The display panel has a display area and a bezel area surrounding the display area, the bezel area includes a fan-out area and a binding area, and the fan-out area is located between the binding area and the display area. Signal lines extending along a first direction are disposed in each of a first edge display area, a center display area, and a second edge display area included in the display area, the first edge display area, the center display area, and the second edge display area are sequentially distributed along a second direction, and the first direction intersects the second direction. A plurality of first connection lines and a plurality of second connection lines are further disposed in the display area, one end of each of the first connection lines extends to the first edge display area and the other end extends to the center display area, and one end of each of the second connection lines extends to the second edge display area and the other end extends to the center display area. A plurality of fan-out leads are disposed in the fan-out area, a drive chip bound to the fan-out leads is disposed in the binding area, the signal lines in the first edge display area are connected to the fan-out leads through the first connection lines, the signal lines in the second edge display area are connected to the fan-out leads through the second connection lines, and the signal lines in the center display area are also connected to the fan-out leads. The drive chip includes a sequence change module, and the sequence change module is configured to change, based on a first correspondence between an arrangement number of each of the fan-out leads and an arrangement number of a signal line connected to the fan-out line, a sequence of first display data in a first display data sequence corresponding to input signal lines, to obtain a second display data sequence, so as to output second display data in the second display data sequence to the fan-out leads. There is a second correspondence between arrangement numbers of the signal lines corresponding to the first display data at a same position sequence number and arrangement numbers of the signal lines corresponding to the second display data, and the first correspondence is the same as the second correspondence.

The position sequence number is a position number of display data in a display data sequence corresponding to the display data, and the arrangement number is an arrangement number of a signal line and a fan-out lead along a same direction. In this way, in this embodiment of this application, one end of the first connection line is connected to the signal line located in the first edge display area, the other end of the first connection line extends to the center display area, one end of the second connection line is connected to the signal line located in the second edge display area, and the other end of the second connection line extends to the center display area, so that the fan-out leads are distributed in an area that is in the fan-out area and in which the center display area extends along the first direction, to reduce a width of a bezel on a first side of the display panel. In addition, the drive chip changes the sequence of the input first display data based on the first correspondence between the arrangement number of each fan-out lead and the arrangement number of the signal line connected to the fan-out lead, so that the second display data obtained through the change can be transmitted to a correct signal line, and the display panel is normally displayed. In addition, the drive chip in this embodiment of this application can be applied to different types of terminal devices, so that a same drive chip can be applied to different terminal devices, to improve utilization of the drive chip and reduce design costs of the drive chip.

In an optional implementation, the second display data in the second display data sequence is sequentially divided into a first change data set, a second change data set, a third change data set, and a fourth change data set in ascending order of position sequence numbers, and the first change data set, the second change data set, the third change data set, and the fourth change data set each include a plurality of pieces of second display data. A change rule between arrangement numbers of signal lines corresponding to the second display data in the first change data set is different from a change rule between arrangement numbers of signal lines corresponding to the second display data in the second change data set, and a change rule between arrangement numbers of signal lines corresponding to the second display data in the fourth change data set is different from a change rule between arrangement numbers of signal lines corresponding to the second display data in the third change data set. In this way, in this embodiment of this application, first display data in a first data set and a fourth data set can be inserted between a start insertion position sequence number and an end insertion position sequence number, so that the sequence of the first display data in the first display data sequence corresponding to the input signal lines is changed to obtain the second display data sequence, and the second display data sequence is divided into the first change data set, the second change data set, the third change data set, and the fourth change data set according to a different change rule between the second display data.

In an optional implementation, the second display data in the first change data set is first change data, and arrangement numbers of signal lines corresponding to the first change data are sequentially increased in ascending order of position sequence numbers of the first change data. The second change data set includes at least one first change data combination, and second display data in each first change data combination includes second change data and third change data; arrangement numbers of signal lines corresponding to the second change data are sequentially increased in ascending order of position sequence numbers of the second change data, and in the same first change data combination, arrangement numbers of signal lines corresponding to the third change data are less than the arrangement numbers of the signal lines corresponding to the second change data; and the second change data is second display data that is input to the signal lines in the center display area, and the third change data is second display data that is input to the signal lines in the first edge display area. The third change data set includes at least one second change data combination, and second display data in each second change data combination includes fourth change data and fifth change data; arrangement numbers of signal lines corresponding to the fourth change data are sequentially increased in ascending order of position sequence numbers of the fourth change data, and in the same second change data combination, arrangement numbers of signal lines corresponding to the fifth change data are greater than the arrangement numbers of the signal lines corresponding to the fourth change data; and the fourth change data is second display data that is input to the signal lines in the center display area, and the fifth change data is second display data that is input to the signal lines in the second edge display area. The second display data in the fourth change data set is sixth change data, and arrangement numbers of signal lines corresponding to the sixth change data are sequentially increased in ascending order of position sequence numbers of the sixth change data. In this way, a sequence change manner in which the drive chip changes the sequence of the first display data in the first display data sequence to obtain the second display data sequence is simpler, and correspondingly, the signal lines corresponding to the first change data and the sixth change data only need to be connected to the corresponding fan-out leads in a sequence in which the signal lines are arranged, so that a connection relationship between the signal line and the fan-out lead in the display panel is simpler.

In an optional implementation, an absolute value of a difference between arrangement numbers of signal lines corresponding to two adjacent pieces of first change data is 1; and an absolute value of a difference between arrangement numbers of signal lines corresponding to two adjacent pieces of sixth change data is 1. In this case, the drive chip only needs to sequentially increase, based on the position sequence number of the first change data, the arrangement numbers of the signal lines corresponding to the first change data in the first change data set, and sequentially increase, based on the position sequence number of the sixth change data, the arrangement numbers of the signal lines corresponding to the sixth change data in the fourth change data set, to reduce complexity of changing the sequence of the first display data in the first display data sequence by the drive chip.

In an optional implementation, an amount of the first change data in the first change data set is equal to an amount of the sixth change data in the fourth change data set.

In an optional implementation, a quantity of first change data combinations included in the second change data set is equal to a quantity of second change data combinations included in the third change data set. The first change data combinations include a same amount of the second change data, and the first change data combinations include a same amount of the third change data. The second change data combinations include a same amount of the fourth change data, and the second change data combinations include a same amount of the fifth change data. An amount of the second change data included in the first change data combination is equal to an amount of the fourth change data included in the second change data combination, and an amount of the third change data included in the first change data combination is equal to an amount of the fifth change data included in the second change data combination. In this way, an amount of the first display data that is in the first data set and that needs to be inserted can be equal to an amount of the first display data that is in the fourth data set and that needs to be inserted, that is, a quantity of signal lines in the first edge display area is equal to a quantity of signal lines in the second edge display area, to minimize a width of a bezel on a first side of the display panel. If the quantity of signal lines in the first edge display area is not equal to the quantity of signal lines in the second edge display area, the width of the bezel on the first side of the display panel is mainly affected by a fan-out lead connected to a signal line in an edge display area in which a quantity of signal lines is small. When the quantity of signal lines in the edge display area is small, the width of the bezel on the first side of the display panel reduces by a smaller amplitude, and consequently the width of the bezel on the first side of the display panel cannot be reduced to the greatest extent.

In an optional implementation, in the same first change data combination, a difference between an arrangement number of a signal line corresponding to the second change data and an arrangement number of a signal line corresponding to the third change data is greater than 1; and in the same second change data combination, a difference between an arrangement number of a signal line corresponding to the fifth change data and an arrangement number of a signal line corresponding to the fourth change data is greater than 1.

In an optional implementation, the second change data set includes a plurality of first change data combinations, and a difference between an arrangement number of a signal line corresponding to second change data having a smallest position sequence number in an $(m+1)^{th}$ first change data combination and an arrangement number of a signal line corresponding to second change data having a largest position sequence number in an $m^{th}$ first change data combination is 1. The third change data set includes a plurality of second change data combinations, and a difference between an arrangement number of a signal line corresponding to fourth change data having a smallest position sequence number in an $(m+1)^{th}$ second change data combination and an arrangement number of a signal line corresponding to fourth change data having a largest position sequence number in an $m^{th}$ second change data combination is 1. Herein, m is a positive integer, a position sequence number of each piece of second change data in the $(m+1)^{th}$ first change data combination is greater than a position sequence number of the second change data in the $m^{th}$ first change data combination, and a position sequence number of each piece of fourth change data in the $(m+1)^{th}$ second change data combination is greater than a position sequence number of the fourth change data in the $m^{th}$ second change data combination. In this way, the arrangement numbers of the signal lines corresponding to the second change data are sequentially increased in ascending order of the position sequence numbers of the second change data, and the arrangement numbers of the signal lines corresponding to the fourth change data are sequentially increased in ascending order of the position sequence numbers of the fourth change data, to further simplify a sequence change manner in which the drive chip changes the sequence of the first display data in the first display data sequence to obtain the second display data sequence.

In an optional implementation, each first change data combination includes a plurality of pieces of second change data, and in the same first change data combination, a difference between an arrangement number of a signal line corresponding to a $(z+1)^{th}$ piece of second change data and an arrangement number of a signal line corresponding to a $z^{th}$ piece of second change data is 1. Each second change data combination includes a plurality of pieces of fourth change data, and in the same second change data combination, a difference between an arrangement number of a signal line corresponding to a $(z+1)^{th}$ piece of fourth change data and an arrangement number of a signal line corresponding to a $z^{th}$ piece of fourth change data is 1. Herein, z is a positive integer, a difference between a position sequence number of the $(z+1)^{th}$ piece of second change data and a position sequence number of the $z^{th}$ piece of second change data is 1, and a difference between a position sequence number of the $(z+1)^{th}$ piece of fourth change data and a position sequence number of the $z^{th}$ piece of fourth change data is also 1. In this way, in the same first change data combination, the arrangement numbers of the signal lines corresponding to the second change data are sequentially increased in ascending order of the position sequence numbers of the second change data, and in the same second change data combination, the arrangement numbers of the signal lines corresponding to the fourth change data are also sequentially increased in ascending order of the position sequence numbers of the fourth change data, to further simply a sequence change manner in which the drive chip changes the sequence of the first display data in the first display data sequence to obtain the second display data sequence.

In an optional implementation, each first change data combination includes a plurality of pieces of third change data, and in the same first change data combination, a difference between an arrangement number of a signal line corresponding to an $r^{th}$ piece of third change data and an arrangement number of a signal line corresponding to an $(r+1)^{th}$ piece of third change data is 1. Each second change data combination includes a plurality of pieces of fifth change data, and in the same second change data combination, a difference between an arrangement number of a signal line corresponding to an $r^{th}$ piece of fifth change data and an arrangement number of a signal line corresponding to an $(r+1)^{th}$ piece of fifth change data is 1. Herein, r is a positive integer, a difference between a position sequence number of the $(r+1)^{th}$ piece of third change data and a position sequence number of the $r^{th}$ piece of third change data is 1, and a difference between a position sequence number of the $(r+1)^{th}$ piece of fifth change data and a position sequence number of the $r^{th}$ piece of fifth change data is also 1. In this way, this embodiment of this application provides a manner in which the arrangement numbers of the signal lines corresponding to the third change data in the same first change data combination are distributed in descending order, and a manner in which the arrangement numbers of the signal lines corresponding to the fifth change data in the same second change data combination are distributed in descending order.

In an optional implementation, each first change data combination includes a plurality of pieces of third change data, and in the same first change data combination, a difference between an arrangement number of a signal line corresponding to an $(r+1)^{th}$ piece of third change data and an arrangement number of a signal line corresponding to an $r^{th}$ piece of third change data is 1. Each second change data combination includes a plurality of pieces of fifth change data, and in the same second change data combination, a difference between an arrangement number of a signal line corresponding to an $(r+1)^{th}$ piece of fifth change data and an arrangement number of a signal line corresponding to an $r^{th}$ piece of fifth change data is 1. Herein, r is a positive integer, a difference between a position sequence number of the $(r+1)^{th}$ piece of third change data and a position sequence number of the $r^{th}$ piece of third change data is 1, and a difference between a position sequence number of the $(r+1)^{th}$ piece of fifth change data and a position sequence number of the $r^{th}$ piece of fifth change data is also 1. In this way, this embodiment of this application provides a manner in which the arrangement numbers of the signal lines corresponding to the third change data in the same first change data combination are distributed in ascending order, and a manner in which the arrangement numbers of the signal lines corresponding to the fifth change data in the same second change data combination are distributed in ascending order.

In an optional implementation, the second change data set includes a plurality of first change data combinations, and a difference between a smallest value of arrangement numbers of signal lines corresponding to third change data in an $m^{th}$ first change data combination and a largest value of arrangement numbers of signal lines corresponding to third change data in an $(m+1)^{th}$ first change data combination is 1. The third change data set includes a plurality of second change data combinations, and a difference between a smallest value of arrangement numbers of signal lines corresponding to fifth change data in an $m^{th}$ second change data combination and a largest value of arrangement numbers of signal lines corresponding to fifth change data in an $(m+1)^{th}$ second change data combination is 1. Herein, m is a positive integer, a position sequence number of each piece of third change data in the $(m+1)^{th}$ first change data combination is greater than a position sequence number of the third change data in the $m^{th}$ first change data combination, and a position sequence number of each piece of fifth change data in the $(m+1)^{th}$ second change data combination is greater than a position sequence number of the fifth change data in the $m^{th}$ second change data combination. In this way, this embodiment of this application provides a manner in which arrangement numbers of signal lines corresponding to third change data in two adjacent first change data combinations are distributed in descending order, and a manner in which arrangement numbers of signal lines corresponding to fifth change data in two adjacent second change data combinations are distributed in descending order.

In an optional implementation, the second change data set includes a plurality of first change data combinations, and a difference between a smallest value of arrangement numbers of signal lines corresponding to third change data in an $(m+1)^{th}$ first change data combination and a largest value of arrangement numbers of signal lines corresponding to third change data in an $m^{th}$ first change data combination is 1. The third change data set includes a plurality of second change data combinations, and a difference between a smallest value of arrangement numbers of signal lines corresponding to fifth change data in an $(m+1)^{th}$ second change data combination and a largest value of arrangement numbers of signal lines corresponding to fifth change data in an $m^{th}$ second change data combination is 1. Herein, m is a positive integer, a position sequence number of each piece of third change data in the $(m+1)^{th}$ first change data combination is greater than a position sequence number of the third change data in the $m^{th}$ first change data combination, and a position sequence number of each piece of fifth change data in the $(m+1)^{th}$ Second change data combination is greater than a position sequence number of the fifth change data in the $m^{th}$ second change data combination. In this way, this embodiment of this application provides a manner in which arrangement numbers of signal lines corresponding to third change data in two adjacent first change data combinations are distributed in ascending order, and a manner in which arrangement numbers of signal lines corresponding to fifth change data in two adjacent second change data combinations are distributed in ascending order.

In an optional implementation, the drive chip further includes a compensation module, a first buffer circuit, a second buffer circuit, a level conversion module, a digital-to-analog conversion module, and an amplification module. The compensation module, the first buffer circuit, the sequence change module, the second buffer circuit, the level conversion module, the digital-to-analog conversion module, and the amplification module are sequentially connected. The compensation module is configured to: perform compensation processing on input initial display data to obtain the first display data, and write the first display data into the first buffer circuit. The sequence change module is further configured to: read the first display data from the first buffer circuit, and write the second display data obtained by changing a sequence of the first display data into the second buffer circuit. The level conversion module is configured to: read the second display data from the second buffer circuit, perform level conversion on the second display data, and input the second display data obtained through level conversion to the digital-to-analog conversion module. The digital-to-analog conversion module is configured to: perform digital-to-analog conversion on the second display data obtained through level conversion, and input the second display data obtained through digital-to-analog conversion to the amplification module. The amplification module is configured to: perform amplification processing on the second display data obtained through digital-to-analog conversion, and output the second display data obtained through amplification processing to each of the fan-out leads. In this way, the compensation module in the drive chip in this embodiment of this application compensates for the display data to improve a display effect of the display panel, and the amplification module in the drive chip performs amplification processing on the second display data obtained by changing the sequence, to increase a corresponding charging rate at which each sub-pixel is charged into the second display data.

According to a second aspect, an embodiment of this application provides a terminal device, including a housing and the foregoing display panel. The display panel is mounted on the housing.

It should be understood that technical solutions of the second aspect in this application correspond to technical solutions of the first aspect in this application, and beneficial effects achieved by the aspects and corresponding feasible embodiments are similar. Details are not described again.

DESCRIPTION OF EMBODIMENTS

To clearly describe technical solutions of embodiments of this application, in embodiments of this application, words such as "first" and "second" are used to distinguish between same or similar items with basically same functions. For example, a first chip and a second chip are merely intended to distinguish between different chips, and a sequence of the first chip and the second chip is not limited. A person skilled in the art may understand that words such as "first" and "second" do not limit a quantity and an execution sequence, and the words such as "first" and "second" do not indicate a definite difference.

It should be noted that in embodiments of this application, a word such as "example" or "for example" is used to represent an example, an illustration, or a description. Any embodiment or design solution described in this application as "example" or "for example" should not be construed as preferred or advantageous over other embodiments or design solutions. Exactly, use of a word such as "example" or "for example" is intended to present related concepts in a specific manner.

In embodiments of this application, "at least one" means one or more, and "a plurality of" means two or more. The term "and/or" is an association relationship for describing associated objects, and may indicate that three relationships may exist. For example. A and/or B may indicate the following cases: Only A exists, both A and B exist, and only B exits, where A and B may be singular or plural. The character "/" usually indicates an "or" relationship between the associated objects. "At least one of the following" or a similar expression thereof refers to any combination of these terms, including any combination of one or more of the following. For example, at least one of a, b, or c may represent a, b, c, a and b, a and c, b and c, or a, b, and c, where a, b, and c may be singular or plural.

Figure 1:
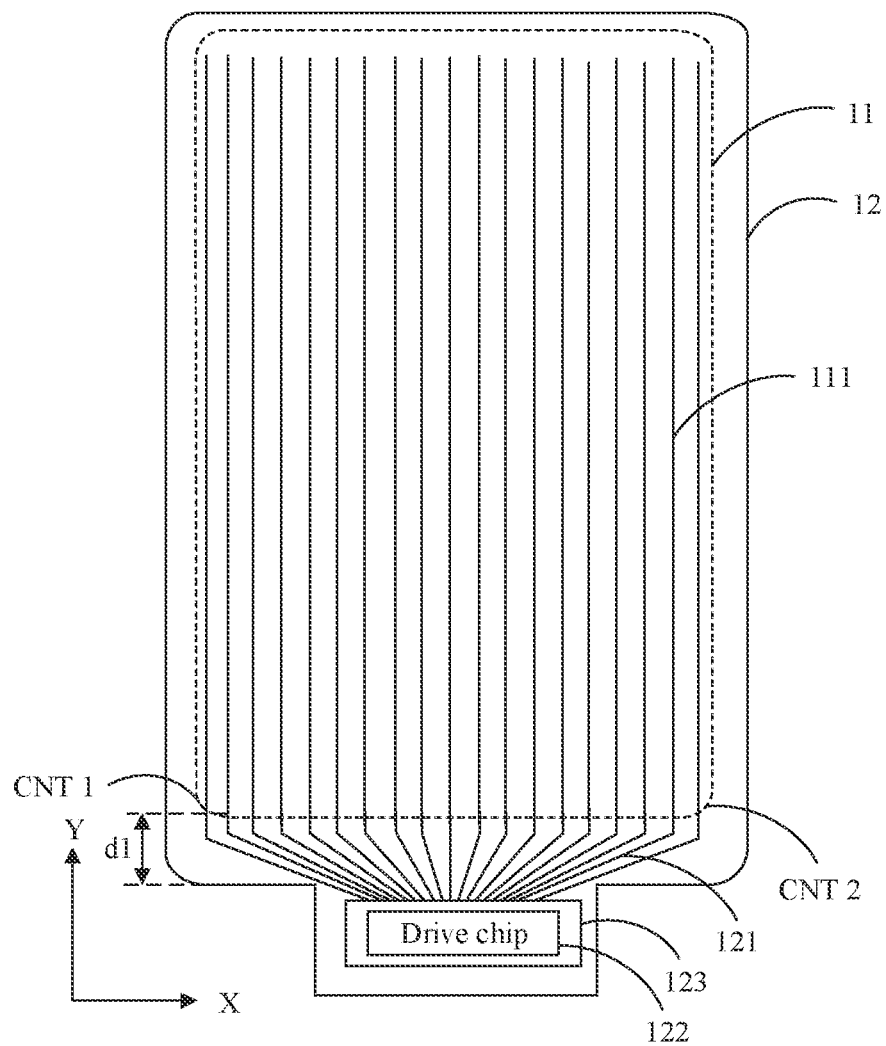
FIG. 1 is a schematic diagram of a structure of a display panel in the related technology.

In the related technology, as shown in FIG. 1, a display panel 10 includes a display area 11 and a bezel area 12 surrounding the display area 11, the bezel area 12 includes a fan-out area and a binding area disposed on a first side of the display area 11, and the fan-out area is located between the binding area and the display area.

A signal line 111 extending along a first direction Y is disposed in the display area 11, and the signal line 111 is a data line. A drive chip 122 is disposed in the binding area. Because a size of the drive chip 122 in a second direction X is less than a size of the display area 11 in the second direction X, and the second direction X is a row direction of the display panel 10, a plurality of fan-out leads 121 need to be disposed in the fan-out area, and the drive chip 122 is connected to the signal line 111 through the fan-out lead 121.

In some products, the drive chip 122 is bound to the binding area in the display panel by using a chip on film (chip on film, COF) 123, and a connection wire is disposed in the chip on film 123. One end of the connection wire is connected to a pin of the drive chip 122, and the other end of the connection wire is connected to a binding terminal (not shown) of the chip on film 123. The fan-out lead 121 is actually connected to the binding terminal of the chip on film 123, so that the fan-out lead 121 is connected to the drive chip 122 based on the chip on film 123. Therefore, display data provided by the drive chip 122 is output from a pin of the drive chip 122, transmitted to the signal line 111 through the connection wire of the chip on film 123, the binding terminal of the chip on film 123, and the fan-out lead 121, and transmitted to a same column of pixel drive circuits through the signal line 111.

Certainly, it may be understood that the drive chip 122 is not limited to be bound to the binding area in the display panel by using the COF, and may also be bound to the binding area by a COG (chip on glass) or a COP (chip on plastic). The COG means that the drive chip is directly bound to the display panel by using an anisotropic conductive glue, and a substrate of the display panel is a glass substrate, and the COP means that the drive chip is directly fastened to the display panel using a plastic substrate, which is applicable to a flexible display panel.

Actually, the display area 11 includes a first edge, a second edge, a third edge, and a fourth edge that are sequentially connected in a head-to-tail manner, the first edge and the second edge are disposed opposite to each other, the third edge and the fourth edge are disposed opposite to each other, and the third edge is disposed adjacent to each of the first edge and the second edge, and the fourth edge is also disposed adjacent to each of the first edge and the second edge. The first edge is an edge of the display area 11 facing a side of the drive chip 122. Actually, a first corner CNT 1 connects the first edge to the third edge, a second corner CNT 2 connects the first edge to the fourth edge, and both the first corner CNT 1 and the second corner CNT 2 are arc-shaped.

Therefore, when the signal line 111 is connected to the binding terminal of the chip on film 123 through the fan-out lead 121, the fan-out lead 121 connected to the signal line 111 close to the third edge of the display area 11 needs to be routed from the first corner CNT 1 to a position of the chip on film 123, and the fan-out lead 121 connected to the signal line 111 close to the fourth edge of the display area 11 needs to be routed from the second corner CNT 2 to the position of the chip on film 123.

Because there is a specific line width of the fan-out lead 121 and there is a specific spacing between two adjacent fan-out leads 121, arrangement of the fan-out lead 121 connected to the signal line 111 close to the third edge of the display area 11 and the fan-out lead 121 connected to the signal line 111 close to the fourth edge of the display area 11 may cause a large width d1 of a bezel on a first side of the display panel 10, and may also affect rounded radians at corners (that is, a lower left corner of the bezel area 12 and a lower right corner of the bezel area 12) in the bezel area 12 in the display panel 10 that correspond to the first corner CNT 1 and the second corner CNT 2. Consequently, a corner position of the display panel 10 cannot be designed to a required radian.

Figure 2:
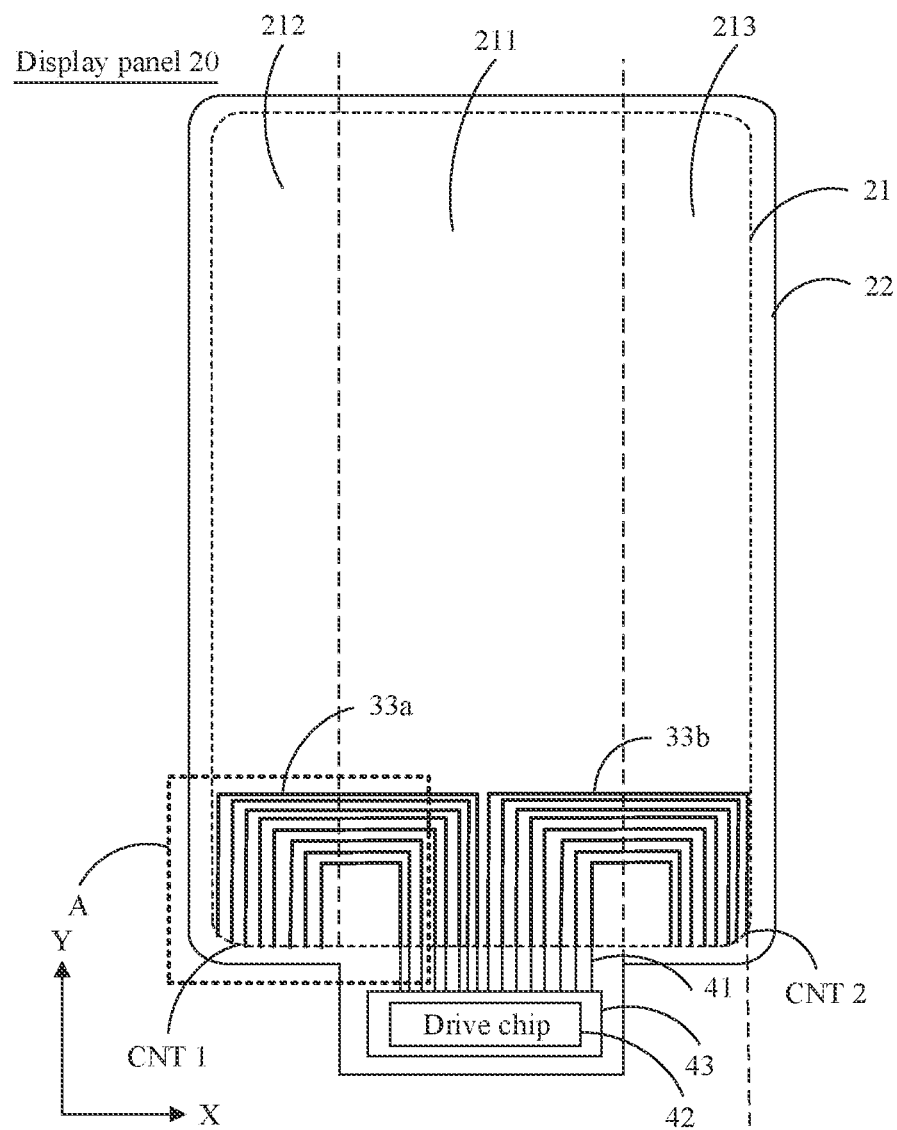
FIG. 2 is a schematic diagram of a structure of a display panel according to an embodiment of this application.
Figure 3:
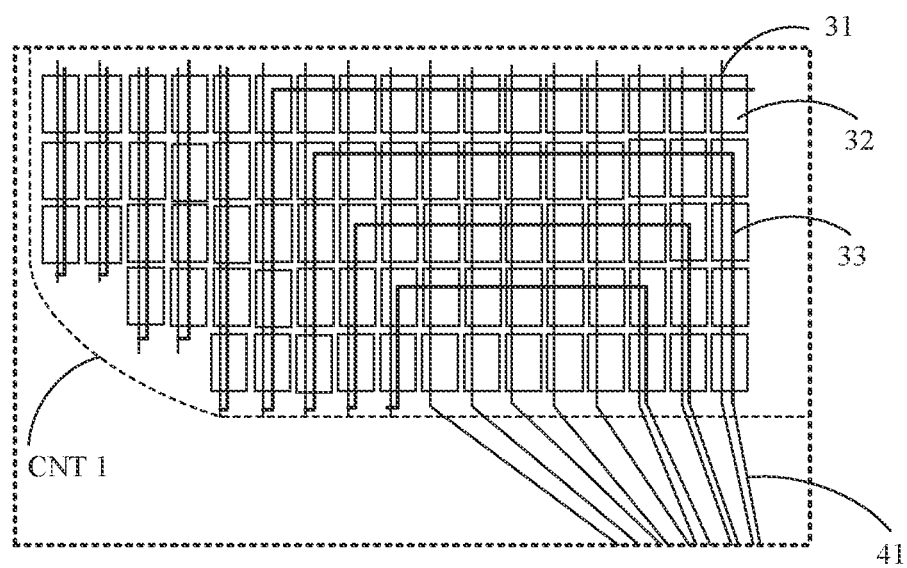
FIG. 3 is a partial enlarged view of an area A of the display panel shown in FIG. 2.

To reduce the width of the bezel on the first side of the display panel 10 and alleviate impact of the fan-out lead 121 on the rounded radian in the corner position of the bezel area 12, as shown in FIG. 2 and FIG. 3, the display panel 20 includes a display area 21 and a bezel area 22 surrounding the display area 21, the display area 21 includes a first edge display area 212, a center display area 211, and a second edge display area 213 that are sequentially distributed along a second direction X, the center display area 211 is located between the first edge display area 212 and the second edge display area 213, the first edge display area 212 is located between the center display area 211 and a third edge of the display area 21, and the second edge display area 213 is located between the center display area 211 and a fourth edge of the display area 21.

A signal line 31 extending along a first direction Y and a plurality of sub-pixels 32 distributed in arrays are disposed in the display area 21. Each sub-pixel 32 includes a pixel drive circuit and a light emitting device connected to the pixel drive circuit, and a same column of pixel drive circuits are connected to a same signal line 31, where the signal line 31 is a data line.

Actually, signal lines extending along a first direction Y are disposed in each of a first edge display area 212, a center display area 211, and a second edge display area 213 included in the display area 21, and the first direction Y intersects a second direction X. In some embodiments, the first direction Y and the second direction X are perpendicular to each other, the first direction Y is a column direction of the display panel 20, and the second direction X is a row direction of the display panel 20.

A first connection line 33a and a second connection line 33b are further disposed in the display area 21 in the display panel 20. One end of the first connection line 33a extends to the first edge display area 212 and is connected to the signal line 31 in the first edge display area 212, and the other end of the first connection line 33a extends to a boundary on a first side of the center display area 211. One end of the second connection line 33b extends to the second edge display area 213 and is connected to the signal line 31 in the second edge display area 213, and the other end of the second connection line 33b extends to the boundary on the first side of the center display area 211.

The bezel area 22 includes a fan-out area and a binding area located on the first side of the display area 21. The fan-out area is located between the binding area and the display area 21. A plurality of fan-out leads 41 are disposed in the fan-out area, and a drive chip 42 is disposed in the binding area. The drive chip 42 is bound to the binding area through a chip on film 43, and the fan-out leads 41 are connected to the drive chip 42 through the chip on film 43. Certainly, the drive chip 42 may also be bound to the binding area in the display panel 20 by using a COG or a COP. For specific descriptions, refer to the descriptions that the drive chip is bound to the binding area in FIG. 1. To avoid repetition, details are not described herein again.

The other end of the first connection line 33a extends to the boundary on the first side of the center display area 211, and is connected to the fan-out lead 41 in the fan-out area at the boundary on the first side of the center display area 211, that is, the signal line 31 in the first edge display area 211 is connected to the fan-out lead 41 through the first connection line 33a. The other end of the second connection line 33b extends to the boundary on the first side of the center display area 211, and is connected to the fan-out lead 41 in the fan-out area at the boundary on the first side of the center display area 211, that is, the signal line 31 in the second edge display area 213 is connected to the fan-out lead 41 through the second connection line 33b. The signal line 31 in the center display area 211 is directly connected to the fan-out lead 41.

Therefore, the fan-out leads 41 may be distributed only in an area obtained after the center display area 211 in the fan-out area extends along the first direction Y, so that the fan-out leads 41 do not need to be routed from the first corner CNT 1 or the second corner CNT 2 of the display area 21 to a position of the chip on film 43, to reduce the width of the bezel on the first side of the display panel 20. In addition, the fan-out leads 41 do not affect too much the rounded radians at the corners in the bezel area 22 in the display panel 20 that correspond to the first corner CNT 1 and the second corner CNT 2. Therefore, the corner position of the display panel 20 can be independently designed based on a required radian.

The first connection line 33a and the second connection line 33b each may include a first sub-line segment, a second sub-line segment pole, and a third sub-line segment that are sequentially connected, the first sub-line segment extends along the first direction Y and is connected to the signal line 31, the second sub-line segment extends along the second direction X, the third sub-line segment extends along the first direction Y and is connected to the fan-out lead 41, and the first direction Y and the second direction X may be perpendicular to each other.

It may be understood that specific structures of the first connection line 33a and the second connection line 33b are not limited to the structure shown in FIG. 2, provided that one end of the first connection line 33a can extend to the first edge display area 212 and is connected to the signal line 31 in the first edge display area 212, and the other end of the first connection line 33a extends to the boundary on the first side of the center display area 211, and one end of the second connection line 33b can extend to the second edge display area 213 and is connected to the signal line 31 in the second edge display area 213, and the other end of the second connection line 33b extends to the boundary on the first side of the center display area 211.

For example, the first connection line 33a and the second connection line 33b each may include only the second sub-line segment and the third sub-line segment that are connected to each other, the second sub-line segment in the first connection line 33a extends along the second direction X and is directly connected to the signal line 31 in the first edge display area 212, the third sub-line segment in the first connection line 33a extends along the first direction Y and extends to the boundary on the first side of the center display area 211, the second sub-line segment in the second connection line 33b extends along the second direction X and is directly connected to the signal line 31 in the second edge display area 213, and the third sub-line segment in the second connection line 33b extends along the first direction Y and extends to the boundary on the first side of the center display area 211.

Alternatively, the first connection line 33a and the second connection line 33b each may include a fourth sub-line segment and a fifth sub-line segment that are connected to each other, the fourth sub-line segment in the first connection line 33a is connected to the signal line 31 in the first edge display area 212, the fifth sub-line segment in the first connection line 33a extends to the boundary on the first side of the center display area 211, and in the first connection line 33a, the fourth sub-line segment and the fifth sub-line segment each have an included angle that is not 0 and that is between the first direction Y and the second direction X, that is, the fourth sub-line segment in the first connection line 33a intersects the first direction Y and the second direction X, and the fifth sub-line segment in the first connection line 33a also intersects the first direction Y and the second direction X. Correspondingly; the fourth sub-line segment in the second connection line 33b is connected to the signal line 31 in the second edge display area 213, the fifth sub-line segment in the second connection line 33b extends to the boundary on the first side of the center display area 211, and in the second connection line 33b, the fourth sub-line segment and the fifth sub-line segment each have an included angle that is not 0 and that is between the first direction Y and the second direction X, that is, the fourth sub-line segment in the second connection line 33b intersects the first direction Y and the second direction X, and the fifth sub-line segment in the second connection line 33b also intersects the first direction Y and the second direction X.

In addition, in the display area 21, the first connection line 33a and the second connection line 33b are disposed at a same layer, and a film layer at which the signal line 31 is located is different from a film layer at which the first connection line 33a and the second connection line 33b are located, that is, the signal line 31 and the first connection line 33a are located at different film layers, and the signal line 31 and the second connection line 33b are also located at different film layers. In addition, the film layer at which the first connection line 33a and the second connection line 33b are located and the film layer at which the signal line 31 is located are separated by at least one insulating layer, that is, the at least one insulating layer is disposed between the film layer at which the first connection line 33a and the second connection line 33b are located and the film layer at which the signal line 31 is located, and the first connection line 33a and the second connection line 33b each are connected to the signal line 31 through a via hole penetrating the insulating layer.

For example, in some embodiments, the first sub-line segment in the first connection line 33a is connected to the signal line 31 in the first edge display area 212 through the via hole penetrating the insulating layer, and the first sub-line segment in the second connection line 33b is connected to the signal line 31 in the second edge display area 213 through the via hole penetrating the insulating layer. In some other embodiments, the fourth sub-line segment in the first connection line 33a is connected to the signal line 31 in the first edge display area 212 through the via hole penetrating the insulating layer, and the fourth sub-line segment in the second connection line 33b is connected to the signal line 31 in the second edge display area 213 through the via hole penetrating the insulating layer.

When the signal line 31 in the first edge display area 212 is connected to the fan-out lead 41 through the first connection line 33a, and the signal line 31 in the second edge display area 213 is connected to the fan-out lead 41 through the second connection line 33b, along a same direction, such as a direction in which a third edge points to a fourth edge, a distribution sequence of a quantity of columns in which signal lines 31 connected to the fan-out leads 41 are located is different from a distribution sequence of a quantity of columns in which signal lines 31 in the display area 21 are located.

For example, along the direction in which the third edge points to the fourth edge, the columns m which the signal lines 31 in the display area 21 are located are respectively a first column, and a second column to a tenth column, that is, the distribution sequence of the quantity of columns in which the signal lines 31 in the display area 21 are located is 1-2-3-4-5-6-7-8-9-10. Assuming that a signal line in the first column is connected to a fifth fan-out lead through the first connection line 33a, a signal line in the tenth column is connected to a sixth fan-out lead through the second connection line 33b, and signal lines in other columns are sequentially and directly connected to fan-out leads 41 in a corresponding sequence, a distribution sequence of a quantity of columns in which the signal lines 31 connected to the ten fan-out leads are located is 2-3-4-5-1-10-6-7-8-9. Therefore, it can be learned that along the same direction, the distribution sequence of the quantity of columns in which the signal lines 31 connected to the fan-out leads 41 are located is different from the distribution sequence of the quantity of columns in which the signal lines 31 in the display area 21 are located.

The quantity of columns m which the signal lines 31 are located actually refers to an arrangement number of the signal line 31 in the display area 21, and the quantity of columns in which the signal lines 31 connected to the fan-out leads 41 are located actually refers to an arrangement number of the signal line 31 connected to the fan-out lead 41. For convenience of description, the quantity of columns in which the signal lines 31 are located is represented by the arrangement number of the signal line 31 below. For example, an arrangement number corresponding to a signal line 31 in a $j^{th}$ column is j, where j is a positive integer.

In addition, in the direction in which the third edge of the display panel 20 points to the fourth edge (that is, the direction from the left to the right), quantities of columns in which the signal lines 31 are located are sequentially 1, 2, 3, ..., and K, where K represents a total quantity of columns (that is, a quantity) of the signal lines 31 in the display panel 20, and the quantity is a positive integer greater than 1. Correspondingly, in the direction in which the third edge of the display panel 20 points to the fourth edge, quantities of columns in which the fan-out leads 41 are located are also sequentially 1, 2, 3 ..., and K, where the quantity of fan-out leads 41 is equal to the quantity of signal lines 31.

In the related technology shown in FIG. 1, if a first connection line and a second connection line are not disposed in the display panel, and each signal line is directly connected to the fan-out lead, an arrangement number of the signal line is the same as an arrangement number of a fan-out lead connected to the signal line. In this case, the drive chip does not need to change a sequence of first display data input to the drive chip, and directly transmits the first display data to the signal line through the fan-out lead. For example, the drive chip transmits an $i^{th}$ piece of first display data Di in a first display data sequence to a fan-out lead with an arrangement number i, and then transmits the $i^{th}$ piece of first display data Di to a signal line with an arrangement number i through the fan-out lead with the arrangement number i.

Usually, a position sequence number of the first display data that is in the first display data sequence and that is input to the drive chip 42 is the same as an arrangement number of a signal line 31 to which the first display data needs to be transmitted, and the position sequence number is a position number of the first display data in the first display data sequence. For example, a position sequence number corresponding to the $i^{th}$ piece of first display data Di in the first display data sequence is i, and the first display data Di with the position sequence number i needs to be transmitted to a signal line 31 in an $i^{th}$ column.

However, when the signal line 31 in the first edge display area 212 is connected to the fan-out lead 41 through the first connection line 33a, and the signal line 31 in the second edge display area 213 is connected to the fan-out lead 41 through the second connection line 33b, in the direction in which the third edge of the display panel 20 points to the fourth edge, the arrangement number of the fan-out lead 41 is different from the arrangement number of the signal line connected to the fan-out lead 41. For example, the fan-out lead 41 with the arrangement number i is connected to the signal line with the arrangement number j, and i and j are different. If the drive chip 42 does not change the sequence of the input first display data, the $i^{th}$ piece of first display data Di in the first display data sequence is transmitted to the fan-out lead 41 with the arrangement number i, and then transmitted to the signal line 31 in the $j^{th}$ column through the fan-out lead 41 with the arrangement number i. Actually, the $i^{th}$ piece of first display data Di needs to be transmitted to the signal line 31 in the $i^{th}$ column. Consequently, display is abnormal.

Therefore, when a distribution sequence of arrangement numbers of signal lines 31 connected to the fan-out leads 41 is different from a distribution sequence of arrangement numbers of signal lines 31 in the display area 21 along a same direction, that is, when an arrangement number of each fan-out lead 41 is different from an arrangement number of a signal line 31 connected to the fan-out lead 41, to ensure that the drive chip 42 can transmit display data to a correct signal line 31, drive chips need to be separately manufactured based on a relationship between the arrangement number of the fan-out lead 41 and the arrangement number of the signal line 31 connected to the fan-out lead 41, so that display data in a correct sequence is provided for the signal lines 31 by using different drive chips 42.

For different types of terminal devices, if quantities and distribution positions of the signal lines 31 connected through the first connection line 33a and the second connection line 33b are different, different drive chips 42 are required to output display data, that is, different terminal devices need to be equipped with different drive chips 42, resulting in high design costs of the drive chips 42.

Based on this, an embodiment of this application provides a display panel. A sequence change module is disposed in the drive chip 42 to change a sequence of display data that is input to the drive chip 42, a first mapping relationship exists between a sequence of display data obtained after the sequence change and a sequence of display data existing before the sequence change in all display data of each row of sub-pixels, a second mapping relationship exists between a sequence of arrangement numbers of signal lines 31 in the display area 21 and a sequence of arrangement numbers of fan-out leads 41 connected to the signal lines 31 along a same direction, and the first mapping relationship is the same as the second mapping relationship, so that the drive chip 42 can input display data to a correct signal line 31 by using the sequence change module. Therefore, for different types of terminal devices, only parameters input to the drive chip 42 need to be changed, so that the drive chip 42 inputs second display data to the correct signal line 31 based on a sequence change algorithm designed in the drive chip 42, that is, the drive chip in embodiments of this application can be applied to different types of terminal devices.

In the following descriptions, display data existing before the sequence change is referred to as first display data, and display data obtained after the sequence change is referred to as second display data. Because the display data is simultaneously transmitted to all the signal lines 211 of a column of sub-pixels when the display data is transmitted to all the signal lines 211 in the display area 21 by the drive chip, all the display data existing before the sequence change of each row of sub-pixels may be referred to as the first display data sequence, and all the display data obtained after the sequence change of each row of sub-pixels may be referred to as the second display data sequence. Therefore, an amount of the first display data in the first display data sequence is equal to a quantity of signal lines 211, and an amount of the second display data in the second display data sequence is also equal to the quantity of signal lines 211. Compared with the first display data sequence, only a sequence of the display data in the second display data sequence is changed.

In addition, there is a first mapping relationship between the sequence of the display data obtained after the sequence change and the sequence of the display data existing before the sequence change, that is, there is a first mapping relationship between an arrangement number of a signal line corresponding to the second display data at a same position sequence number and an arrangement number of a signal line corresponding to the first display data. For convenience of subsequent descriptions, a relationship between the arrangement number of the signal line corresponding to the first display data at the same position sequence number and the arrangement number of the signal line corresponding to the second display data is referred to as a second correspondence. In this case, the second correspondence and the first mapping relationship are opposite to each other.

Correspondingly, there is a second mapping relationship between a sequence of the arrangement numbers of the signal lines 31 in the display area 21 and the sequence of the arrangement numbers of the fan-out leads 41 connected to the signal lines 31, that is, there is a second mapping relationship between an arrangement number of each signal line 31 and an arrangement number of the fan-out lead 41 connected to the signal line 31. For convenience of subsequent description, a relationship between an arrangement number of each fan-out lead 41 and an arrangement number of a signal line 31 connected to the fan-out lead 41 is referred to as a first correspondence. In this case, the first correspondence and the second mapping relationship are opposite to each other.

In the following descriptions, the first correspondence is used to represent the relationship between the arrangement number of each fan-out lead 41 and the arrangement number of the signal line 31 connected to the fan-out lead 41, and the second correspondence is used to represent the relationship between the arrangement number of the signal line corresponding to the first display data at the same position sequence number and the arrangement number of the signal line corresponding to the second display data.

Therefore, an arrangement number of a signal line 31 corresponding to an $i^{th}$ piece of first display data Di in the first display data sequence is 1. After the drive chip 42 changes the sequence of the first display data Di, an arrangement number of a signal line 31 corresponding to an $i^{th}$ piece of second display data in the second display data sequence is j, that is, the $i^{th}$ piece of second display data is Dj. In this case, the second correspondence is i–j. The $i^{th}$ piece of second display data Dj in the second display data sequence is output from an $i^{th}$ pin of the drive chip 42, and then transmitted to a fan-out lead 41 with an arrangement number i, that is, transmitted to an $i^{th}$ fan-out lead 41. The fan-out lead with the arrangement number i is connected to the signal line 31 with the arrangement number j (directly connected or connected through a connection line 33), that is, the first correspondence is i–j. The first correspondence is the same as the second correspondence, so that the $i^{th}$ piece of second display data Dj that is in the second display data sequence and that is obtained after the sequence change can be correctly transmitted to a signal line 31 in a $j^{th}$ column.

Therefore, for different types of terminal devices, a same drive chip 42 may be used, and a sequence change module is disposed in the drive chip 42. When the first correspondence between the arrangement number of each fan-out lead 41 and the arrangement number of the signal line 31 connected to the fan-out lead 41 is equivalent to the second correspondence between the arrangement number of the signal line 31 corresponding to the first display data at the same position sequence number and the arrangement number of the signal line 31 corresponding to the second display data, the same drive chip 42 can be applied to the different types of terminal devices, to improve utilization of the drive chip 42 and reduce design costs of the drive chip 42.

The following describes, in detail by using specific examples, the technical solutions of this application and how the foregoing technical problems are resolved by using the technical solutions of this application. The following specific embodiments may be implemented independently or may be combined with each other, and a same or similar concept or process may not be described in some embodiments.

Figure 4:
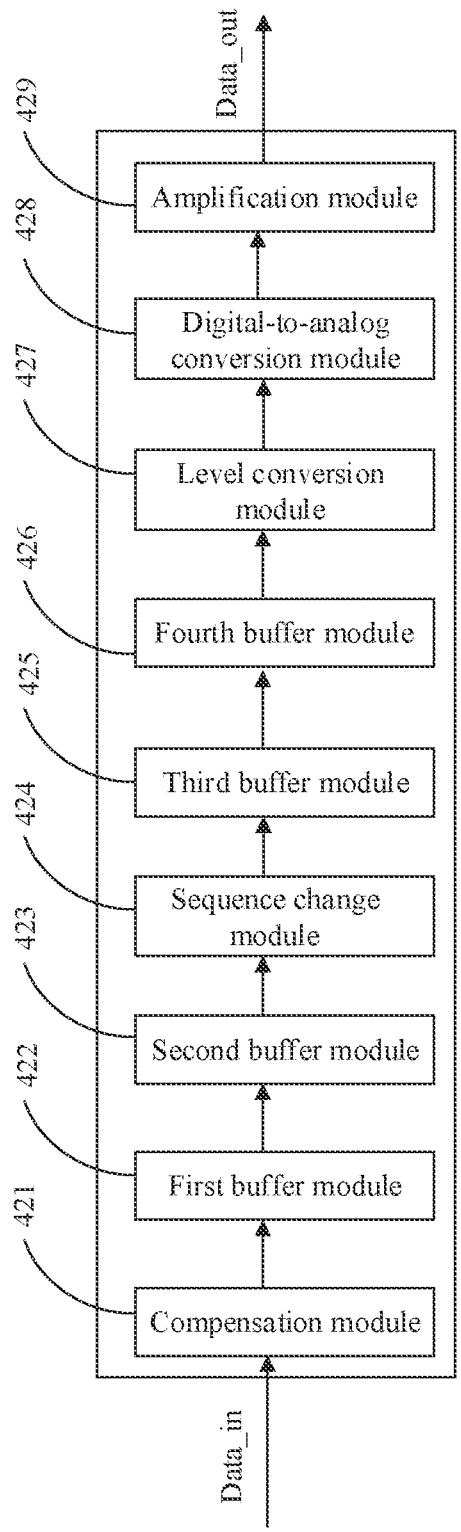
FIG. 4 is a schematic diagram of a structure of a drive chip according to an embodiment of this application.

For example, FIG. 4 is a schematic diagram of a structure of a drive chip according to an embodiment of this application. As shown in FIG. 4, a drive chip 42 disposed in a binding area in a display panel 20 includes a compensation module 421, a first buffer module 422, a second buffer module 423, a sequence change module 424, a third buffer module 425, a fourth buffer module 426, a level conversion module 427, a digital-to-analog conversion module 428, and an amplification module 429 that are sequentially connected.

In an actual driving process, when display data is input to the drive chip 42, the compensation module 421 in the drive chip 42 first performs different arithmetic compensation processing on input display data (Data in) in display positions. Display data input to the compensation module 421 in the drive chip 42 may be referred to as initial display data, and display data obtained after the compensation module 421 compensates the initial display data may be referred to as first display data.

For example, the compensation module 421 performs demura compensation or voltage drop (IR drop) compensation on each piece of input initial display data. The initial display data may be any one of display data of a red sub-pixel, display data of a green sub-pixel, and display data of a blue sub-pixel.

The demura compensation is an external compensation method. An automated optical inspection (automated optical inspection, AOI) device is mainly used to detect mura (mura) of the display panel 20, and perform demura compensation after detecting the mura, to reduce a mura phenomenon of the display panel 20.

In the display panel 20, each column of pixel drive circuits needs to be connected to a ELVDD signal line. Because the ELVDD signal line has specific impedance, a power supply voltage signal transmitted on the ELVDD signal line inevitably has a specific voltage drop. As a result, voltage values corresponding to power supply voltage signals that are input from the same ELVDD signal line to pixel drive circuits connected to the same ELVDD signal line are different, and drive currents that are input from the pixel drive circuits connected to the same ELVDD signal line to a light emitting device are different. When the drive currents are different, brightness of the display panel is uneven. Therefore, to improve brightness unevenness of the display panel caused by the impedance of the ELVDD signal line, different compensation voltage values may be compensated for the initial display data based on display positions of the initial display data.

After performing algorithm compensation processing on the input initial display data, the compensation module 421 in the drive chip 42 writes first display data obtained after the compensation processing into the first buffer module 422, and then reads the first display data from the first buffer module 422 and writes the first display data into the second buffer module 423. The first display data is written into the first buffer module 422, read from the first buffer module 422, and written into the second buffer module 423 in units of bits (bits).

When all the first display data in the first display data sequence is written into the second buffer module 423, all the first display data in the first display data sequence is read from the second buffer module 423 and input to the sequence change module 424.

The first buffer module 422 and the second buffer module 423 in the drive chip 42 jointly form a first buffer circuit, that is, the first buffer circuit includes the first buffer module 422 and the second buffer module 423 that are sequentially connected.

Figure 5:
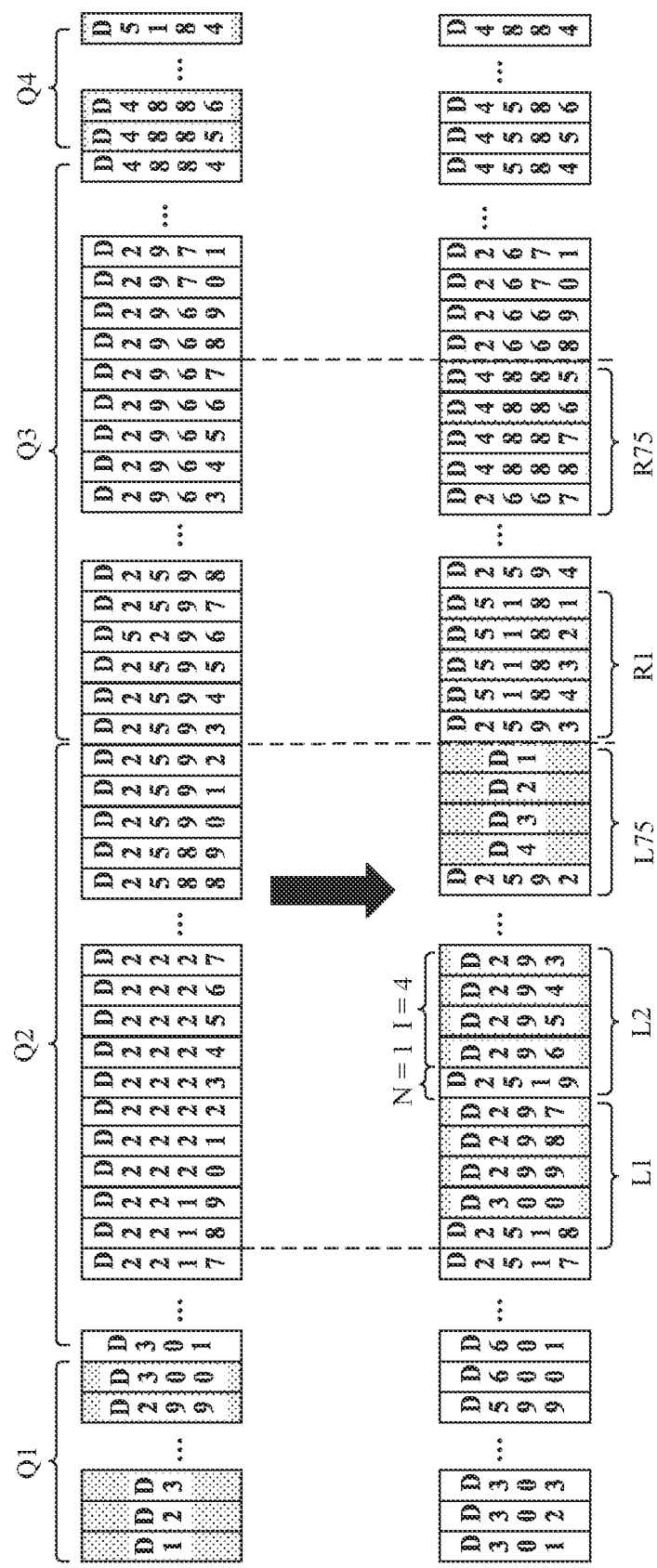
FIG. 5 is a first schematic diagram of performing sequence change processing by a drive chip according to an embodiment of this application.
Figure 6:
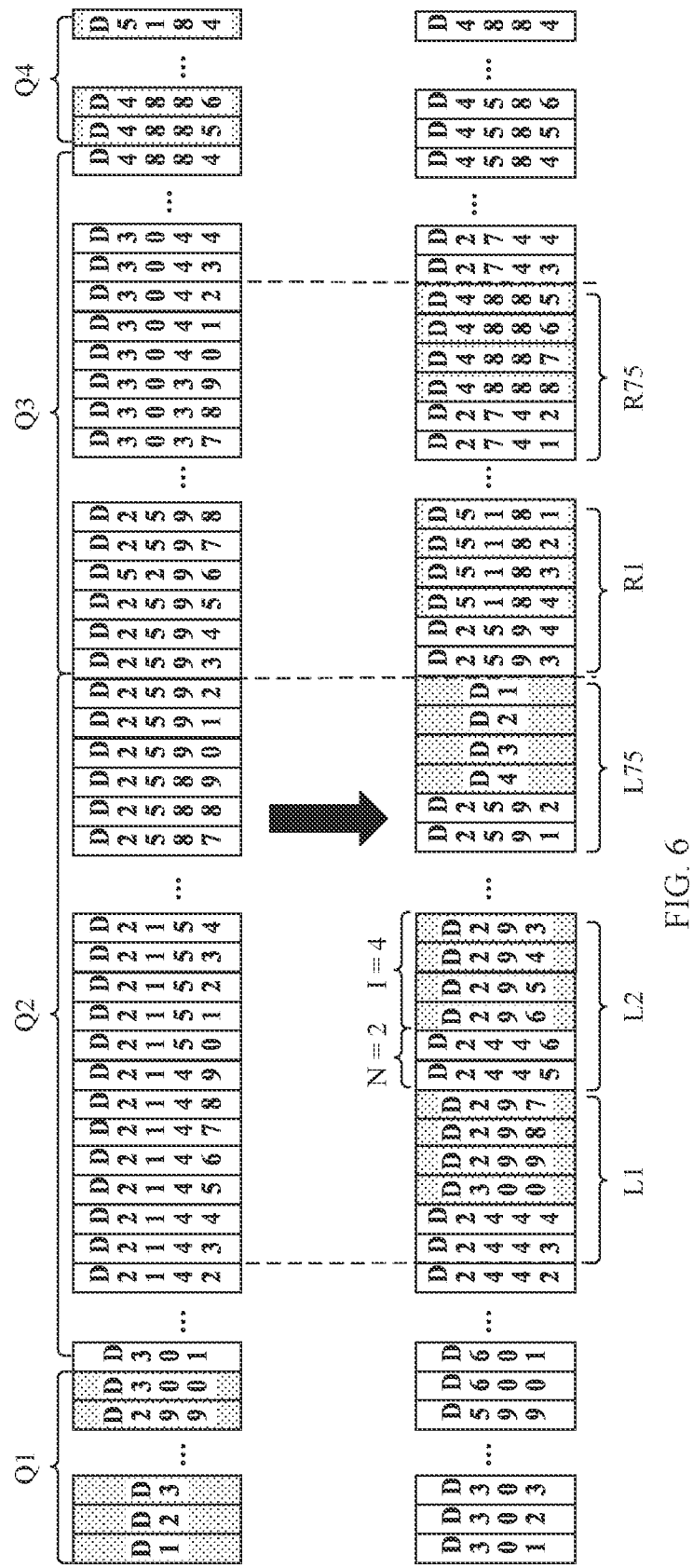
FIG. 6 is a second schematic diagram of performing sequence change processing by a drive chip according to an embodiment of this application.

As shown in FIG. 5 and FIG. 6, for each row of sub-pixels, the first display data input to the sequence change module 424 in the drive chip 42 is divided into a first data set Q1, a second data set Q2, a third data set Q3, and a fourth data set Q4. Both a signal line 31 corresponding to the first display data in the first data set Q1 and a signal line 31 corresponding to the first display data in the second data set Q2 are located between a center axis and the third edge of the display panel 20, and the signal line 31 corresponding to the first display data in the second data set Q2 is located between the signal line 31 corresponding to the first display data in the first data set Q1 and the center axis of the display panel 20. Both a signal line 31 corresponding to the first display data in the third data set Q3 and a signal line 31 corresponding to the first display data in the fourth data set Q4 are located between the center axis and the fourth edge of the display panel 20, and the signal line 31 corresponding to the first display data in the third data set Q3 is located between the signal line 31 corresponding to the first display data in the fourth data set Q4 and the center axis of the display panel 20.

In addition, the signal line 31 corresponding to the first display data in the first data set Q1 and the signal line 31 corresponding to the first display data in the fourth data set Q4 are symmetrically distributed along the center axis of the display panel 20, that is, an amount of the first display data in the first data set Q1 is equal to an amount of the first display data in the fourth data set Q4. The signal line 31 corresponding to the first display data in the second data set Q2 and the signal line 31 corresponding to the first display data in the third data set Q3 are symmetrically distributed along the center axis of the display panel 20, that is, the amount of the first display data in the second data set Q2 is equal to the amount of the first display data in the third data set Q3, and the center axis extends along a first direction Y.

The first data set Q1 is a set of first display data that subsequently needs to be inserted into the second data set Q2, and a total amount of the first display data in the first data set Q1 is equal to a total quantity of columns of the signal lines 31 in the first edge display area 212. The second data set Q2 and the third data set Q3 each are a set of first display data that does not require data insertion, and a sum of a total amount of the first display data in the second data set Q2 and a total amount of the first display data in the third data set Q3 is equal to a total quantity of columns of the signal lines 31 in the center display area 211. The fourth data set Q4 is a set of first display data that subsequently needs to be inserted into the third data set Q3, and a total amount of the first display data in the fourth data set Q4 is equal to a total quantity of columns of the signal lines 31 in the second edge display area 213.

For example, as shown in FIG. 5 and FIG. 6, assuming that a total quantity of columns of the signal lines in the display panel 20 is 5184, an amount of first display data that is in the first display data sequence corresponding to each signal line 31 and that is input to the drive chip 42 is 5184, that is, first display data D1 of a signal line 31 in a first column, first display data D2 of a signal line 31 in a second column, . . . , and first display data D5184 of a signal line 31 in a $5184^{th}$ column. The first data set Q1 is a set of the first display data D1 of the signal line 31 in the first column to the first display data D300 of the signal line 31 in the $300^{th}$ column, the second data set Q2 is a set of the first display data D301 of the signal line 31 in the $301^{st}$ column to the first display data D2592 of the signal line 31 in the $2592^{nd}$ column, the third data set Q3 is a set of the first display data D2593 of the signal line 31 in the $2593^{th}$ column to the first display data D4884 of the signal line 31 in the $4884^{th}$ column, and the fourth data set Q4 is a set of the first display data D4885 of the signal line 31 in the $4885^{th}$ column to the first display data D5184 of the signal line 31 in the $5184^{th}$ column.

Before changing the sequence of the input first display data, the sequence change module 424 needs to first determine first display data in a start insertion position and first display data in an end insertion position. In the following descriptions, the start insertion position is referred to as a start insertion position sequence number, the end insertion position is referred to as an end insertion position sequence number, the first display data at the start insertion position sequence number may be located in the second data set Q2, and the first display data at the end insertion position sequence number may be located in the third data set Q3. For example, in FIG. 5, the start insertion position sequence number is 2218, that is, the first display data at the start insertion position sequence number is display data D2218 of a signal line in a $2218^{th}$ column, and the end insertion position sequence number is 2968, that is, first display data at the end insertion position sequence number is display data D2968 of a signal line in a $2968^{th}$ column. In FIG. 6, the start insertion position sequence number is 2143, that is, first display data at the start insertion position sequence number is display data D2143 of a signal line in a $2143^{rd}$ column, and the end insertion position sequence number is 3043, that is, first display data at the end insertion position sequence number is display data D3043 of a signal line in a $3043^{rd}$ column.

After the first display data at the start insertion position sequence number and the first display data at the end insertion position sequence number are determined, the first display data in the first data set Q1 starts to be inserted after the first display data at the start insertion position sequence number until all the first display data in the first data set Q1 is inserted before a critical position sequence number between the second data set Q2 and the third data set Q3; and the first display data in the fourth data set Q4 starts to be inserted after the critical position sequence number between the third data set Q3 and the second data set Q2 until all the first display data in the fourth data set Q4 is inserted before the end insertion position sequence number. The critical position sequence number may also be a center position sequence number, that is, ½ of a total quantity K of columns of the signal lines 31 in the display panel 20. For example, when the total quantity K of columns of the signal lines 31 in the display panel 20 is 5184, the center position sequence number is 2592.

Therefore, in this embodiment of this application, first display data in the first data set Q1 and the fourth data set Q4 is inserted between the start insertion position sequence number and the end insertion position sequence number, so that the sequence of the first display data in the first display data sequence corresponding to the input signal lines 31 is changed to obtain the second display data sequence.

After the sequence change module in the drive chip changes the sequence of the first display data in the first display data sequence in the foregoing insertion manner to obtain the second display data sequence, change rules between second display data in the second display data sequence are different, and according to the different change rules, the second display data in the second display data sequence can be sequentially divided into a first change data set, a second change data set, a third change data set, and a fourth change data set in ascending order of position sequence numbers of the second display data, and the first change data set, the second change data set, the third change data set, and the fourth change data set each include a plurality of pieces of second display data.

A set of second display data whose position sequence number is less than a start insertion position sequence number is referred to as the first change data set. Assuming that the start insertion position sequence number is s, the position sequence number i of the second display data in the first change data set satisfies 0<i<s, that is, the position sequence number of the second display data in the first change data set in this embodiment of this application is a positive integer greater than 1 and less than s, a minimum value in position sequence numbers of the second display data in the first change data set is 1, and a maximum value in the position sequence numbers of the second display data in the first change data set is s−1. The second display data in the first change data set may be referred to as first change data.

For example, in FIG. 5, the second display data in the first change data set is a first piece of second display data to a $2217^{th}$ piece of second display data in the second display data sequence. In FIG. 6, the second display data in the first change data set is a first piece of second display data to a $2142^{nd}$ piece of second display data in the second display data sequence.

A set of second display data whose position sequence number is greater than or equal to a start insertion position sequence number and less than or equal to a center position sequence number is referred to as the second change data set. Assuming that the start insertion position sequence number is s and the center position sequence number is K/2, the position sequence number i of the second display data in the second change data set satisfies s≤i≤K/2, that is, the position sequence number of the second display data in the second change data set in this embodiment of this application is a positive integer greater than or equal to s and less than or equal to K/2, a minimum value in position sequence numbers of the second display data in the second change data set is equal to s, and a maximum value in the position sequence numbers of the second display data in the second change data set is equal to K/2.

For example, in FIG. 5, the second display data in the second change data set is a $2218^{th}$ piece of second display data to a $2592^{nd}$ piece of second display data in the second display data sequence. In FIG. 6, the second display data in the second change data set is a $2143^{rd}$ piece of second display data to a $2592^{nd}$ piece of second display data in the second display data sequence.

A set of second display data whose position sequence number is greater than a center position sequence number and less than an end insertion position sequence number is referred to as the third change data set. Assuming that the center position sequence number is K/2 and the end insertion position sequence number is e, the position sequence number i of the second display data in the third change data set satisfies K/2<i<e, that is, the position sequence number of the second display data in the third change data set in this embodiment of this application is a positive integer greater than K/2 and less than e, a minimum value in position sequence numbers of the second display data in the third change data set is 1+K/2, and a maximum value in the position sequence numbers of the second display data in the third change data set is e−1.

For example, in FIG. 5, the second display data in the third change data set is a $2593^{rd}$ piece of second display data to a $2967^{th}$ piece of second display data in the second display data sequence. In FIG. 6, the second display data in the third change data set is a $2593^{rd}$ piece of second display data to a $3042^{nd}$ piece of second display data in the second display data sequence.

A set of second display data whose position sequence number is greater than or equal to an end insertion position sequence number and less than or equal to a total quantity of columns of the signal lines 31 in the display panel 20 is referred to as the fourth change data set. Assuming that the end insertion position sequence number is e and the total quantity of columns of the signal lines 31 in the display panel 20 is K, the position sequence number i of the second display data in the fourth change data set satisfies e≤i≤K, that is, the position sequence number of the second display data in the fourth change data set in this embodiment of this application is a positive integer greater than or equal to e and less than or equal to K, a minimum value in position sequence numbers of the second display data in the fourth change data set is equal to e, and a maximum value in the position sequence numbers of the second display data in the fourth change data set is equal to K. The second display data in the fourth change data set may be referred to as sixth change data.

For example, in FIG. 5, the second display data in the fourth change data set is a $2968^{th}$ piece of second display data to a $5184^{th}$ piece of second display data in the second display data sequence. In FIG. 6, the second display data in the fourth change data set is a $3043^{rd}$ piece of second display data to a $5184^{th}$ piece of second display data in the second display data sequence.

In this embodiment of this application, when the first display data in the first data set Q1 is inserted into the second data set Q2, I pieces of first display data in the first data set Q1 may be inserted between every two adjacent pieces of first display data in the second data set Q2. When the first display data in the fourth data set Q4 is inserted into the third data set Q3, I pieces of first display data in the fourth data set Q4 may be inserted between two adjacent pieces of first display data in the third data set Q3.

As shown in FIG. 5, if the first display data at the start insertion position sequence number is the display data D2218 of the signal line in the $2218^{th}$ column, and the first display data at the end insertion position sequence number is the display data D2968 of the signal line in the $2968^{th}$ column, after four (that is, 1=4) pieces of first display data in the first data set Q1 are inserted between two adjacent pieces of first display data in the second data set Q2, so that in the second display data sequence, a first piece of second display data is second display data D301 of a signal line in a $301^{st}$ column, a second piece of second display data D302 is second display data of a signal line in a $302^{nd}$ column, . . . , and a $2217^{th}$ piece of second display data D2517 is second display data of a signal line in a $2517^{th}$ column, that is, the first change data set in the second display data sequence includes the second display data D301 of the signal line in the $301^{st}$ column to the second display data of the signal line in the $2517^{th}$ column.

In the second display data sequence, a $2218^{th}$ piece of second display data D2518 is second display data of a signal line in a $2518^{th}$ column, a $2219^{th}$ piece of second display data D300 is second display data of a signal line in a $300^{th}$ column, a $2220^{th}$ piece of second display data D299 is second display data of a signal line in a $299^{th}$ column, a $2221^{th}$ piece of second display data D298 is second display data of a signal line in a $298^{th}$ column, a $2222^{nd}$ piece of second display data D297 is second display data of a signal line in a $297^{th}$ column, a $2223^{rd}$ piece of second display data D2519 is second display data of a signal line in a $2519^{th}$ column, . . . , and a $2592^{nd}$ piece of second display data D1 is second display data of a signal line in a first column.

Correspondingly, in the second display data sequence, a $2593^{rd}$ piece of second display data D2593 is second display data of a signal line in a $2593^{rd}$ column, a $2594^{th}$ piece of second display data D5184 is second display data of a signal line in a $5184^{th}$ column, a $2595^{th}$ piece of second display data D5183 is second display data of a signal line in a $5183^{rd}$ column, a $2596^{th}$ piece of second display data D5182 is second display data of a signal line in a $5182^{nd}$ column, a $2597^{th}$ piece of second display data D5181 is second display data of a signal line in a $5181^{st}$ column, a $2598^{th}$ piece of second display data D2594 is second display data of a signal line in a $2594^{th}$ column, . . . , and a $2967^{th}$ piece of second display data D4885 is second display data of a signal line in a $4885^{th}$ column.

In the second display data sequence, a $2968^{th}$ piece of second display data D2668 is second display data of a signal line in a $2668^{th}$ column, a $2969^{th}$ piece of second display data D2669 is second display data of a signal line in a $2669^{th}$ column, . . . , and a $5184^{th}$ piece of second display data D4884 is second display data of a signal line in a $4884^{th}$ column.

A sequence change rule of the display data shown in FIG. 5 is that four pieces of first display data in the first data set Q1 are inserted between every two adjacent pieces of first display data in the second data set Q2, four pieces of second display data in the fourth data set Q4 are inserted between every two adjacent pieces of first display data in the third data set Q3, and the signal line 31 corresponding to the first display data at the start insertion position sequence number and the signal line 31 corresponding to the first display data at the end insertion position sequence number are symmetrically disposed along the center axis of the display panel 20.

For example, in the second display data sequence shown in FIG. 5, the $2218^{th}$ piece of second display data is the second display data D2518 of the signal line in the $2518^{th}$ column, the $2223^{rd}$ piece of second display data is the second display data D2519 of the signal line in the $2519^{th}$ column, and the second display data D300 of the signal line in the $300^{th}$ column, the second display data D299 of the signal line in the $299^{th}$ column, the second display data D298 of the signal line in the $298^{th}$ column, and the second display data D297 of the signal line in the $297^{th}$ column are inserted between the $2218^{th}$ piece of second display data and the $2223^{rd}$ piece of second display data. In addition, only one piece of first display data in the second data set Q2 exists between the inserted second display data D297 of the signal line in the $297^{th}$ column and the inserted second display data D296 of the signal line in the $296^{th}$ column, and is the second display data D2519 of the signal line in the $2519^{th}$ column.

It may be understood that an amount of the first display data that is in the first data set Q1 and that is inserted between every two adjacent pieces of first display data in the second data set Q2 is not limited to four, or may be three, five, or the like. In addition, when the first display data in the first data set Q1 is inserted, as shown in FIG. 5, the first display data in the first data set Q1 may be inserted at an interval of one piece of the first display data in the second data set Q2, or the first display data in the first data set Q1 may be inserted at an interval of two, three, or the like pieces of the first display data in the second data set Q2. Correspondingly, an amount of the first display data that is in the fourth data set Q4 and that is inserted between every two adjacent pieces of first display data in the third data set Q3 is not limited to four, or may be three, five, or the like. In addition, when the first display data in the fourth data set Q4 is inserted, as shown in FIG. 5, the first display data in the fourth data set Q4 may be inserted at an interval of one piece of the first display data in the third data set Q3, or the first display data in the fourth data set Q4 may be inserted at an interval of two, three, or the like pieces of the first display data in the third data set Q3.

For example, as shown in FIG. 6, in the second display data sequence, the first display data in the first data set Q1 is inserted at an interval of two pieces of first display data in the second data set Q2, and the first display data in the fourth data set Q4 is inserted at an interval of two pieces of first display data in the third data set Q3, that is, N=2. For example, in the second display data sequence, if the $2148^{th}$ piece of second display data is the second display data D297 of the signal line of in the $297^{th}$ column, and the $2151^{st}$ piece of second display data is the second display data D296 of the signal line in the $296^{th}$ column, two pieces of first display data that originally belong to the second data set Q2, that is, the second display data D2445 of the signal line in the $2445^{th}$ column and the second display data D2446 of the signal line in the $2446^{th}$ column, exist between the inserted second display data D297 of the signal line in the $297^{th}$ column and the inserted second display data D296 of the signal line in the $296^{th}$ column.

It should be noted that the first display data and the second display data are merely intended to distinguish between the display data existing before the sequence change and the display data obtained after the sequence change, and the first display data and the second display data corresponding to a same arrangement number are actually the same, except that position sequence numbers of the first display data and the second display data in each data sequence are different. For example, the first display data D2446 of the signal line in the 2446$^{th}$ column is actually the same as the second display data D2446 of the signal line in the 2446th Column, except that the first display data D2446 of the signal line in the 2446$^{th}$ column has a position sequence number 2446 in the first display data sequence, and the second display data D2446 of the signal line in the 2446$^{th}$ column has a position sequence number 2150 in the second display data sequence, as shown in FIG. 6.

In conclusion, for a specific display panel 20, a total quantity of columns of signal lines 31 in the display panel 20 is K, and an amount of first display data in the first data set Q1 and an amount of first display data in the fourth data set Q4 each are C, that is, a total quantity of columns of signal lines 31 in the first edge display area 212 and a total quantity of columns of signal lines 31 in the second edge display area 213 each are C, an amount of first display data that is in the first data set Q1 and that is inserted between every two adjacent pieces of first display data in the second data set Q2 is I, and an amount of first display data that is in the fourth data set Q4 and that is inserted between every two adjacent pieces of first display data in the third data set Q3 is also I. In addition, in the second display data sequence obtained after the first display data in the first data set Q1 and the first display data in the fourth data set Q4 are inserted, an amount of first display data in the second data set Q2 existing between two adjacent pieces of first display data in the first data set Q1 is N, and an amount of first display data in the third data set Q3 existing between two adjacent pieces of first display data in the fourth data set Q4 is also N. Herein, K, C, I, and N are all positive integers. If the first display data corresponding to the start insertion position sequence number is Ds, the start insertion position sequence number is $s=K/2-(I+N)\times(C/I)+1$. If the first display data corresponding to the end insertion position sequence number is De, the end insertion position sequence number is $e=K/2+(I+N)\times(C/I)+1$. Herein, s represents the start insertion position sequence number, and e represents the end insertion position sequence number.

It can be learned based on the second display data sequence shown in FIG. 5 and FIG. 6 that for the first change data set and the fourth change data set in the second display data sequence, in the first display data sequence, arrangement numbers of signal lines corresponding to the first display data are sequentially increased in ascending order of position sequence numbers of the first display data. Therefore, in the second display data sequence obtained by inserting the first display data in the first data set Q1 between the first display data in the second data set Q2 and inserting the first display data in the fourth data set Q4 between the first display data in the third data set Q3 to change the sequence of the first display data in the first display data sequence, arrangement numbers of signal lines corresponding to first change data are also sequentially increased in ascending order of position sequence numbers of the first change data, and arrangement numbers of signal lines corresponding to sixth change data are also sequentially increased in ascending order of position sequence numbers of the sixth change data.

In some embodiments, when the sequence of the first display data in the first display data sequence is changed, if only the first display data in the first data set Q1 is inserted between the first display data in the second data set Q2, the first display data in the fourth data set Q4 is inserted between the first display data in the third data set Q3, and a sequence of remaining first display data is not changed, an absolute value of a difference between arrangement numbers of signal lines corresponding to two adjacent pieces of first change data is 1, and an absolute value of a difference between arrangement numbers of signal lines corresponding to two adjacent pieces of sixth change data is 1.

That is, the arrangement numbers of the signal lines corresponding to the first change data are sequentially increased at an equal interval of 1 in ascending order of the position sequence numbers of the first change data. Because a difference between two adjacent position sequence numbers is also 1, if the arrangement numbers of the signal lines corresponding to the first change data are sequentially increased at an equal interval of 1, a difference between arrangement numbers of signal lines corresponding to any two pieces of first change data is equal to a difference between position sequence numbers corresponding to the any two pieces of first change data Correspondingly, the arrangement numbers of the signal lines corresponding to the sixth change data are sequentially increased at an equal interval of 1 in ascending order of the position sequence numbers of the sixth change data. Because a difference between two adjacent position sequence numbers is also 1, if the arrangement numbers of the signal lines corresponding to the sixth change data are sequentially increased at an equal interval of 1, a difference between arrangement numbers of signal lines corresponding to any two pieces of sixth change data is equal to a difference between position sequence numbers corresponding to the any two pieces of sixth change data.

For the second change data set in the second display data sequence, because the first display data in the first data set Q1 is inserted between the start insertion position sequence number and the center position sequence number, the second change data set includes the first display data that originally belongs to the first data set Q1 and the first display data that originally belongs to the second data set Q2. Therefore, the second change data set can be divided into at least one first change data combination based on an insertion position of the first display data in the first data set Q1, and second display data in each first change data combination includes second change data and third change data. The second change data is the first display data in the second data set Q2, that is, the second change data is second display data input to the signal line in the center display area 211 (that is, a center display area in which the center axis of the display panel 20 faces a side of the first edge display area 212). The third change data is the first display data in the first data set Q1, that is, the third change data is second display data input to the signal line in the first edge display area 212.

In some embodiments, after the first display data in the first data set Q1 is inserted between two adjacent pieces of first display data in the second data set Q2, position sequence numbers corresponding to the first display data that is in the second data set Q2 and that is adjacent to all the first display data in the first data set Q1 are the same, that is, in the second display data sequence, the first display data in the second data set Q2 does not exist between any two adjacent pieces of first display data in the first data set Q1, and in this case, the second change data set may include one first change data combination.

In some other embodiments, when the first display data in the first data set Q1 is inserted, the first display data in the first data set Q1 may be divided into C/I pieces, where C represents a total quantity of columns of the signal lines 31 in the first edge display area 212, I represents an amount of the first display data that is in the first data set Q1 and that needs to be inserted between two adjacent pieces of first display data in the second data set Q2, and C/I is a positive integer greater than 1. Each piece of the first display data in the first data set Q1 is inserted between two adjacent pieces of first display data having different position sequence numbers in the second data set Q2, that is, in the second display data sequence obtained after the first display data in the first data set Q1 is inserted, the first display data in the second data set Q2 exists between two adjacent pieces of first display data in the first data set Q1, and in this case, the second change data set includes a plurality of first change data combinations.

In conclusion, the second change data set may include at least one first change data combination, and the second display data in each first change data combination includes second change data and third change data. If the sequence of the first display data in the second data set Q2 is not changed when the first display data in the first data set Q1 is inserted, the arrangement numbers of the signal lines corresponding to the second change data are sequentially increased in ascending order of position sequence numbers of the second change data. In addition, because the third change data is actually the first display data in the first data set Q1 and the second change data is actually the first display data in the second data set Q2, in a same first change data combination, an arrangement number of a signal line corresponding to the third change data is less than an arrangement number of a signal line corresponding to the second change data. Therefore, the arrangement numbers of the signal lines corresponding to the second display data in the second change data set are partially increased and partially decreased in ascending order of the position sequence numbers of the second display data in the second change data set.

For the third change data set in the second display data sequence, because the first display data in the fourth data set Q4 is inserted between the center position sequence number and the end insertion position sequence number, the third change data set includes the first display data that originally belongs to the fourth data set Q4 and the first display data that originally belongs to the third data set Q3. Therefore, the third change data set can be divided into at least one second change data combination based on an insertion position of the first display data in the fourth data set Q4, and second display data in each second change data combination includes fourth change data and fifth change data. The fourth change data is the first display data in the third data set Q3, that is, the fourth change data is second display data input to the signal line in the center display area 211 (that is, a center display area in which the center axis of the display panel 20 faces a side of the second edge display area 213). The fifth change data is the first display data in the fourth data set Q4, that is, the fifth change data is second display data input to the signal line in the second edge display area 213.

In some embodiments, after the first display data in the fourth data set Q4 is inserted between two adjacent pieces of first display data in the third data set Q3, position sequence numbers corresponding to the first display data that is in the third data set Q3 and that is adjacent to all the first display data in the fourth data set Q4 are the same, that is, in the second display data sequence, the first display data in the third data set Q3 does not exist between any two adjacent pieces of first display data in the fourth data set Q4, and in this case, the third change data set may include one second change data combination.

In some other embodiments, when the first display data in the fourth data set Q4 is inserted, the first display data in the fourth data set Q4 may be divided into C/I pieces, where C represents a total quantity of columns of the signal lines 31 in the second edge display area 213, I represents an amount of the first display data that is in the fourth data set Q4 and that needs to be inserted between two adjacent pieces of first display data in the third data set Q3, and C/A is a positive integer greater than 1. Each piece of the first display data in the fourth data set Q4 is inserted between two adjacent pieces of first display data having different position sequence numbers in the third data set Q3, that is, in the second display data sequence obtained after the first display data in the fourth data set Q4 is inserted, the first display data in the third data set Q3 exists between two adjacent pieces of first display data in the fourth data set Q4, and in this case, the third change data set may include a plurality of second change data combinations.

In conclusion, the third change data set may include at least one second change data combination, and the second display data in each second change data combination includes fourth change data and fifth change data. If the sequence of the first display data in the third data set Q3 is not changed when the first display data in the fourth data set Q4 is inserted, the arrangement numbers of the signal lines corresponding to the fourth change data are sequentially increased in ascending order of position sequence numbers of the fourth change data. In addition, because the fifth change data is actually the first display data in the fourth data set Q4 and the fourth change data is actually the first display data in the third data set Q3, in a same second change data combination, an arrangement number of a signal line corresponding to the fifth change data is less than an arrangement number of a signal line corresponding to the fourth change data. Therefore, the arrangement numbers of the signal lines corresponding to the second display data in the third change data set are partially increased and partially decreased in ascending order of the position sequence numbers of the second display data in the third change data set.

It can be learned through the foregoing analysis that the arrangement numbers of the signal lines corresponding to the first change data in the first change data set are sequentially increased in ascending order of the position sequence numbers of the second display data in the second display data sequence, and the arrangement numbers of the signal lines corresponding to the second display data in the second change data set are partially increased and partially decreased. Therefore, a change rule between the arrangement numbers of the signal lines corresponding to the second display data in the first change data set is different from a change rule between the arrangement numbers of the signal lines corresponding to the second display data in the second change data set.

Correspondingly, the arrangement numbers of the signal lines corresponding to the second display data in the fourth change data set are also sequentially increased in ascending order of the position sequence numbers of the second display data in the second display data sequence, and the arrangement numbers of the signal lines corresponding to the second display data in the third change data set are partially increased and partially decreased. Therefore, a change rule between the arrangement numbers of the signal lines corresponding to the second display data in the fourth change data set is different from a change rule between the arrangement numbers of the signal lines corresponding to the second display data in the third change data set.

It should be noted that, in some embodiments, when the first display data in the first data set Q1 is inserted between the first display data in the second data set Q2, the sequence of the first display data in the second data set Q2 may be further changed, so that an absolute value of a difference between arrangement numbers of signal lines corresponding to two adjacent pieces of first change data is not limited to 1, for example, the absolute value of the difference between the arrangement numbers of the signal lines corresponding to the two adjacent pieces of first change data may be 2 or 3. Correspondingly, when the first display data in the fourth data set Q4 is inserted between the first display data in the third data set Q3, the sequence of the first display data in the third data set Q3 may be further changed, so that an absolute value of a difference between arrangement numbers of signal lines corresponding to two adjacent pieces of sixth change data is not limited to 1, for example, the absolute value of the difference between the arrangement numbers of the signal lines corresponding to the two adjacent pieces of sixth change data may be 2 or 3.

The following schematically describes, with respect to the sequence change rule shown in FIG. 5 and FIG. 6, specific calculation manners of the arrangement numbers of the signal lines corresponding to the second display data in the second display data sequence and the first display data in the first display data sequence at a same position sequence number.

If a position sequence number of an $i^{th}$ piece of first display data in the first display data sequence is less than the start insertion position sequence number, that is, in the first display data sequence, the $i^{th}$ piece of first display data is located before the first display data Ds corresponding to the start insertion position sequence number, that is, 0<i<s, for example, s may be 2218 or 2143, a ranking of the $i^{th}$ piece of display data Di in the first display data sequence is changed. Assuming that an $i^{th}$ piece of second display data that is in the second display data sequence and that is obtained after the sequence change is Dj, that is, at the position sequence number i, the sequence change module in the drive chip changes the first display data Di of the signal line in the $i^{th}$ column to the second display data Dj of the signal line in the $j^{th}$ column, j=i+C.

If a position sequence number of an $i^{th}$ piece of first display data in the first display data sequence is greater than or equal to the start insertion position sequence number and less than or equal to the center position sequence number, that is, in the first display data sequence, the piece of first display data is located between the first display data Ds corresponding to the start insertion position sequence number and the first display data of the signal line at the center axis of the display panel 20, that is, s≤i≤K/2, a position sequence number between the start insertion position sequence number and the center position sequence number is divided into C/I position sequence number groups, where the position sequence number may also be referred to as a sequence number, the position sequence number group may also be referred to as a sequence group, such as a first position sequence number group L1, a second position sequence number group L2, . . . , and a $75^{th}$ position sequence number group L75, and a combination of second display data in each position sequence number group before the center position sequence number is referred to as the first change data combination.

After the ranking of the $i^{th}$ piece of first display data Di in the first display data sequence is changed, the first change data combination corresponding to each position sequence number group includes I pieces of third change data and N pieces of second change data. For second change data Dj in an $m^{th}$ first change data combination in the second change data set, it can be learned that j=i+C-I(m-1), and for an $r^{th}$ piece of third change data Dj in the $m^{th}$ first change data combination in the second change data set, it can be learned that j=C-I(m-1)-(r-1), where 1≤r≤I, and 1≤m≤C/I.

For example, for second change data D2518 in a $1^{st}$ first change data combination corresponding to the first position sequence number group L1 in FIG. 5, i=2218, C=300, I=4, and m=1. In this case, j=2218+300-4(1-1)=2518. For a first (that is, r=1) piece of third change data D300 in the $1^{st}$ first change data combination corresponding to the first position sequence number group L1 in FIG. 5, j=300-4(1-1)-(1-1)=300.

If a position sequence number of an $i^{th}$ piece of first display data in the first display data sequence is greater than the center position sequence number and less than the end insertion position sequence number, that is, in the first display data sequence, the $i^{th}$ piece of first display data is located between the first display data of the signal line at the center axis of the display panel and the first display data De corresponding to the end insertion position sequence number, that is, K/2≤i≤e, for example, e may be 2968 or 3043, a position sequence number between the center position sequence number and the end insertion position sequence number is divided into C/I position sequence number groups, such as a first position sequence number group RI to a $75^{th}$ position sequence number group R75, and a combination of second display data in each position sequence number group after the center position sequence number is referred to as the second change data combination.

After the ranking of the $i^{th}$ piece of first display data Di in the first display data sequence is changed, the second change data combination corresponding to each position sequence number group includes I pieces of fifth change data and N pieces of fourth change data. For fourth change data Dj in an $m^{th}$ second change data combination in the third change data set, it can be learned that j=i+C-I(C/I+m-1), and for an $r^{th}$ piece of fifth change data Dj in the $m^{th}$ second change data combination in the third change data set, it can be learned that j=K-I(m-1)-(r-1), where 1≤r≤I, and 1≤m≤C/I.

For example, for fourth change data D2593 in the first position sequence number group RI in FIG. 5, i=2593, C=300, I=4, and m=1. In this case, j=2593+300-4(300/4+1-1)=2593. For a first (that is, r=1) piece of fifth change data D4888 in the $75^{th}$ position sequence number group R75 in FIG. 5, j=5184-4(75-1)-(1-1)=4888.

If a position sequence number of an $i^{th}$ piece of first display data in the first display data sequence is greater than or equal to the end insertion position sequence number, that is, in the first display data sequence, the $i^{th}$ piece of first display data is located after the first display data De corresponding to the end insertion position sequence number, that is, e≤i≤K, a ranking of the $i^{th}$ piece of first display data Di in the first display data sequence is changed. Assuming that an $i^{th}$ piece of second display data that is in the second display data sequence and that is obtained after the sequence change is Dj, j=i-C.

After the insertion is performed according to the foregoing method, when the start insertion position sequence number and the end insertion position sequence number are symmetrically set along the center position sequence number, an amount of the first change data in the first change data set can be equal to an amount of the sixth change data in the fourth change data set, where the amounts each are s-1.

When an amount of the first display data in the first data set Q1 and an amount of the first display data in the fourth data set Q4 each are C, and a quantity I of first data sets Q1 inserted between every two adjacent pieces of first display data in the second data set Q2 is equal to a quantity I of fourth data sets Q4 inserted between every two adjacent pieces of first display data in the third data set Q3, a quantity of first change data combinations included in the second change data set is equal to a quantity of second change data combinations included in the third change data set, where the quantities each are C/I.

In addition, amounts of second change data included in first change data combinations are equal, and each are N, and amounts of third change data included in first change data combinations are equal, and each are I; and amounts of fourth change data included in second change data combinations are equal, and each are N, and amounts of fifth change data included in second change data combinations are equal, and each are I That is, an amount of the second change data included in the first change data combination is equal to an amount of the fourth change data included in the second change data combination, and an amount of the third change data included in the first change data combination is equal to an amount of the fifth change data included in the second change data combination.

As shown in FIG. 5 and FIG. 6, in the same first change data combination, a difference between an arrangement number of a signal line corresponding to the second change data and an arrangement number of a signal line corresponding to the third change data is greater than 1; and in the same second change data combination, a difference between an arrangement number of a signal line corresponding to the fifth change data and an arrangement number of a signal line corresponding to the fourth change data is greater than 1. For example, in a $1^{st}$ first change data combination shown in FIG. 5, the arrangement number of the signal line corresponding to the second change data is 2518, and the arrangement numbers of the signal lines corresponding to the third change data are respectively 300, 299, 298, and 297. In this case, in the $1^{st}$ first change data combination, differences between the arrangement number of the signal line corresponding to the second change data and the arrangement numbers of the signal lines corresponding to the third change data each are greater than 1.

When the second change data set includes a plurality of first change data combinations, for example, the second change data set shown in FIG. 5 and FIG. 6 includes 75 first change data combinations, a difference between an arrangement number of a signal line corresponding to second change data having a smallest position sequence number in an $(m+1)^{th}$ first change data combination and an arrangement number of a signal line corresponding to second change data having a largest position sequence number in an $m^{th}$ first change data combination is 1, that is, arrangement numbers of signal lines corresponding to second change data included in two adjacent first change data combinations in the second change data set are in ascending order.

Correspondingly, when the third change data set includes a plurality of second change data combinations, for example, the third change data set shown in FIG. 5 and FIG. 6 includes 75 second change data combinations, a difference between an arrangement number of a signal line corresponding to fourth change data having a smallest position sequence number in an $(m+1)^{th}$ second change data combination and an arrangement number of a signal line corresponding to fourth change data having a largest position sequence number in an $m^{th}$ second change data combination is 1, that is, arrangement numbers of signal lines corresponding to fourth change data included in two adjacent second change data combinations in the third change data set are in ascending order.

Herein, m is a positive integer, a position sequence number of each piece of second change data in the $(m+1)^{th}$ first change data combination is greater than a position sequence number of the second change data in the $m^{th}$ first change data combination, and a position sequence number of each piece of fourth change data in the $(m+1)^{th}$ second change data combination is greater than a position sequence number of the fourth change data in the $m^{th}$ second change data combination.

For example, m is 1. In FIG. 6, an arrangement number of a signal line corresponding to second change data having a smallest position sequence number in a $2^{nd}$ first change data combination is 2445, and an arrangement number of a signal line corresponding to second change data having a largest position sequence number in a $1^{st}$ first change data combination is 2444. In this case, a difference between the arrangement number 2445 of the signal line corresponding to the second change data having the smallest position sequence number in the $2^{nd}$ first change data combination and the arrangement number 2444 of the signal line corresponding to the second change data having the largest position sequence number in the $1^{st}$ first change data combination is 1.

In some embodiments, each first change data combination includes a plurality of pieces of second change data, that is, N is a positive integer greater than 1, and in the same first change data combination, a difference between an arrangement number of a signal line corresponding to a $(z+1)^{th}$ piece of second change data and an arrangement number of a signal line corresponding to a $z^{th}$ piece of second change data is 1, that is, in each first change data combination, sequence numbers of signal lines corresponding to two adjacent pieces of second change data are sequentially increased at an equal interval of 1. Each second change data combination includes a plurality of pieces of fourth change data, that is, N is a positive integer greater than 1, and in the same second change data combination, a difference between an arrangement number of a signal line corresponding to a $(z+1)^{th}$ piece of fourth change data and an arrangement number of a signal line corresponding to a $z^{th}$ piece of fourth change data is 1, that is, in each second change data combination, sequence numbers of signal lines corresponding to two adjacent pieces of fourth change data are sequentially increased at an equal interval of 1. Herein, z is a positive integer greater than N, a difference between a position sequence number of the $(z+1)^{th}$ piece of second change data and a position sequence number of the $z^{th}$ piece of second change data is 1, and a difference between a position sequence number of the $(z+1)^{th}$ piece of fourth change data and a position sequence number of the $z^{th}$ piece of fourth change data is also 1.

For example, in FIG. 6, in each first change data combination, a difference between an arrangement number of a signal line corresponding to a $2^{nd}$ piece of second change data and an arrangement number of a signal line corresponding to a $1^{st}$ piece of second change data is 1; and in each second change data combination, a difference between an arrangement number of a signal line corresponding to a $2^{nd}$ piece of fourth change data and an arrangement number of a signal line corresponding to a I piece of fourth change data is 1.

It should be noted that all positions in which the first display data D1 of the signal line in the first column is inserted are middle positions in which all the first display data in this row is inserted, that is, the first display data D1 of the signal line in the first column changes to a $(K/2)^{th}$ pixel in all pixels in this row after insertion. Certainly, it may be understood that the position in which the first display data $D1$ of the signal line in the first column is inserted may also change to another position, for example, the first display data changes to a $(K/4)^{th}$ pixel in all the pixels in this row or a $(1+K/2)^{th}$ pixel in all the pixels in this row after insertion. This is not limited in this embodiment of this application. For example, for the sequence change rule of the display data shown in FIG. 5, a ranking of the first display data $D1$ of the signal line in the first column is changed, to change from a $1^{st}$ piece of first display data in the first display data sequence to a $2592^{nd}$ piece of second display data in the second display data sequence, or certainly, change from a $1^{st}$ piece of first display data in the first display data sequence to a $2593^{rd}$ piece of second display data in the second display data sequence.

Correspondingly, a position in which first display data $D_K$ of a signal line in a last column is inserted may be close to a middle position of the second display data sequence, for example, the position in which the first display data $D_K$ of the signal line in the last column is inserted is a $(K/2+N+1)^{th}$ second display data sequence in second display data sequences. The position in which the first display data $D_K$ of the signal line in the last column is inserted may alternatively deviate from the middle position of the second display data sequence, for example, the position in which the insertion is performed changes to a $(3K/4)^{th}$ second display data sequence in second display data sequences. This is not limited in this embodiment of this application.

In addition, as shown in FIG. 5 and FIG. 6, when the first display data in the first data set Q1 is inserted, the first display data is inserted in descending order of arrangement numbers of signal lines corresponding to the first display data. When the first display data in the fourth data set Q4 is inserted, the first display data is also inserted in descending order of arrangement numbers of signal lines corresponding to the first display data. Certainly, it may be understood that, in this embodiment of this application, distribution rules of arrangement numbers of signal lines corresponding to the first display data that is in the first data set Q1 and the fourth data set Q4 and that is inserted into the second display data sequence are not limited to those shown in FIG. 5 and FIG. 6, or may be in another manner.

To more clearly describe the distribution rules of the arrangement numbers of the signal lines corresponding to the first display data that is in the first data set Q1 and the fourth data set Q4 and that is inserted into the second display data sequence in this embodiment of this application, a distribution rule of arrangement numbers of signal lines corresponding to the third change data in each first change data combination and the fifth change data in each second change data combination may be described, and distribution rules of arrangement numbers of signal lines corresponding to the third change data in two adjacent first change data combinations and the fifth change data in two adjacent second change data combinations may be described.

Figure 8:
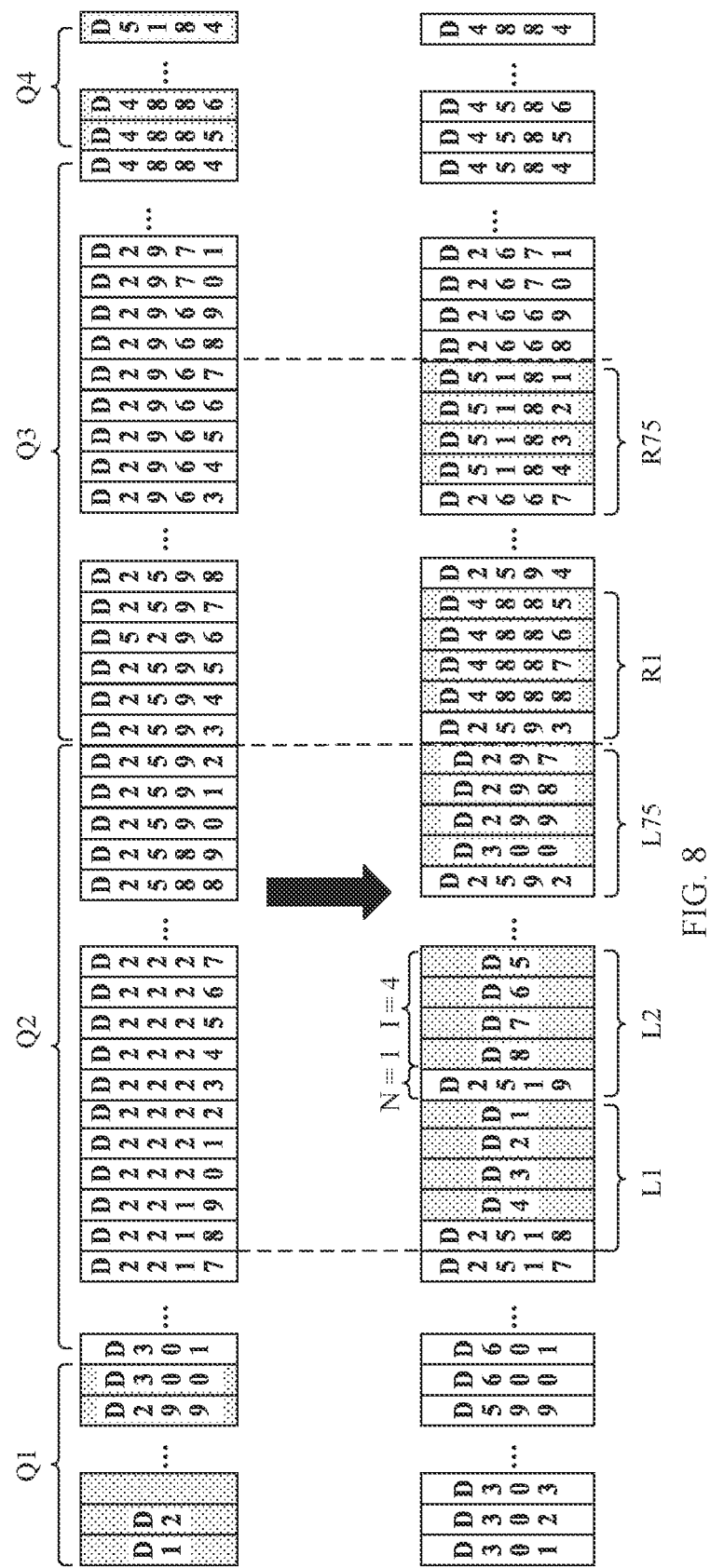
FIG. 8 is a fourth schematic diagram of performing sequence change processing by a drive chip according to an embodiment of this application.

In some embodiments, as shown in FIG. 5 and FIG. 8, each first change data combination includes a plurality of pieces of third change data, and in the same first change data combination, a difference between an arrangement number of a signal line corresponding to an $r^{th}$ piece of third change data and an arrangement number of a signal line corresponding to an $(r+1)^{th}$ piece of third change data is 1, that is, arrangement numbers of signal lines corresponding to the third change data in each first change data combination are in descending order. Each second change data combination includes a plurality of pieces of fifth change data, and in the same second change data combination, a difference between an arrangement number of a signal line corresponding to an $r^{th}$ piece of fifth change data and an arrangement number of a signal line corresponding to an $(r+1)^{th}$ piece of fifth change data is 1, that is, arrangement numbers of signal lines corresponding to the fifth change data in each second change data combination are in descending order. Herein, r is a positive integer less than I, a difference between a position sequence number of the $(r+1)^{th}$ piece of third change data and a position sequence number of the $r^{th}$ piece of third change data is 1, and a difference between a position sequence number of the $(r+_1)^{th}$ piece of fifth change data and a position sequence number of the $r^{th}$ piece of fifth change data is also 1.

In one case, as shown in FIG. 5, the second change data set includes a plurality of first change data combinations, and a difference between a smallest value of arrangement numbers of signal lines corresponding to third change data in an $m^{th}$ first change data combination and a largest value of arrangement numbers of signal lines corresponding to third change data in an $(m+1)^{th}$ first change data combination is 1, that is, arrangement numbers of signal lines corresponding to the third change data included in two adjacent first change data combinations are in descending order. The third change data set includes a plurality of second change data combinations, and a difference between a smallest value of arrangement numbers of signal lines corresponding to fifth change data in an $m^{th}$ second change data combination and a largest value of arrangement numbers of signal lines corresponding to fifth change data in an $(m+1)^{th}$ second change data combination is 1, that is, arrangement numbers of signal lines corresponding to the fifth change data included in two adjacent second change data combinations are in descending order. Herein, in is a positive integer less than C/I, a position sequence number of each piece of third change data in the $(m+1)^{th}$ first change data combination is greater than a position sequence number of the third change data in the $m^{th}$ first change data combination, and a position sequence number of each piece of fifth change data in the $(m+1)^{th}$ second change data combination is greater than a position sequence number of the fifth change data in the $m^{th}$ second change data combination.

In this case, a difference between an arrangement number of a signal line corresponding to an $I^{th}$ piece of third change data m the $m^{th}$ first change data combination and an arrangement number of a signal line corresponding to a $1^{st}$ piece of third change data in the $(m+1)^{th}$ first change data combination is 1; and a difference between an arrangement number of a signal line corresponding to an $I^{th}$ piece of fifth change data in the $m^{th}$ second change data combination and an arrangement number of a signal line corresponding to a $1^{st}$ piece of fifth change data in the $(m+1)^{th}$ second change data combination is 1.

That is, when the first display data in the first data set Q1 is inserted, the first display data may be inserted m descending order of arrangement numbers of signal lines corresponding to the first display data, that is, in a reverse order. In this case, after first display data with a smaller arrangement number of a signal line corresponding to the first display data in the first data set Q1 is inserted, the first display data is closer to a center position of all second display data in the second display data sequence. When the first display data in the fourth data set Q4 is inserted, the first display data may be inserted in descending order of arrangement numbers of signal lines corresponding to the first display data, that is, in a reverse order. In this case, after first display data with a larger arrangement number of a signal line corresponding to the first display data in the fourth data set Q4 is inserted, the first display data is closer to a center position of all second display data in the second display data sequence.

In another case, as shown in FIG. 8, the second change data set includes a plurality of first change data combinations, and a difference between a smallest value of arrangement numbers of signal lines corresponding to third change data in an $(m+1)^{th}$ first change data combination and a largest value of arrangement numbers of signal lines corresponding to third change data in an $m^{th}$ first change data combination is 1, that is, arrangement numbers of signal lines corresponding to the third change data included in two adjacent first change data combinations are in ascending order. The third change data set includes a plurality of second change data combinations, and a difference between a smallest value of arrangement numbers of signal lines corresponding to fifth change data in an $(m+1)^{th}$ second change data combination and a largest value of arrangement numbers of signal lines corresponding to fifth change data in an $m^{th}$ second change data combination is 1, that is, arrangement numbers of signal lines corresponding to the fifth change data included in two adjacent second change data combinations are in ascending order.

In this case, a difference between an arrangement number of a signal line corresponding to an $I^{th}$ piece of third change data in the $(m+1)^{th}$ first change data combination and an arrangement number of a signal line corresponding to a $1^{st}$ piece of third change data in the $m^{th}$ first change data combination is 1; and a difference between an arrangement number of a signal line corresponding to an $I^{th}$ piece of fifth change data in the $(m+1)^{th}$ second change data combination and an arrangement number of a signal line corresponding to a $1^{st}$ piece of fifth change data in the $m^{th}$ second change data combination is 1.

Certainly, it may be understood that, when the first display data in the first data set Q1 is inserted, arrangement numbers of signal lines corresponding to the first display data inserted into each first change data combination are in descending order, and arrangement numbers of signal lines corresponding to the first display data inserted into two adjacent first change data combinations may be in ascending order. Correspondingly, when the first display data in the fourth data set Q4 is inserted, arrangement numbers of signal lines corresponding to the first display data inserted into each second change data combination are in descending order, and arrangement numbers of signal lines corresponding to the first display data inserted into two adjacent second change data combinations may be in ascending order.

For example, first display data inserted into a $1^{st}$ first change data combination are respectively first display data D4 of a signal line in a fourth column, first display data D3 of a signal line in a third column, first display data D2 of a signal line in a second column, and first display data D1 of a signal line in a first column, and first display data inserted into a $2^{nd}$ first change data combination are respectively first display data D8 of a signal line in an eighth column, first display data D7 of a signal line in a seventh column, first display data D6 of a signal line in a sixth column, and first display data D5 of a signal line in a fifth column.

Figure 7:
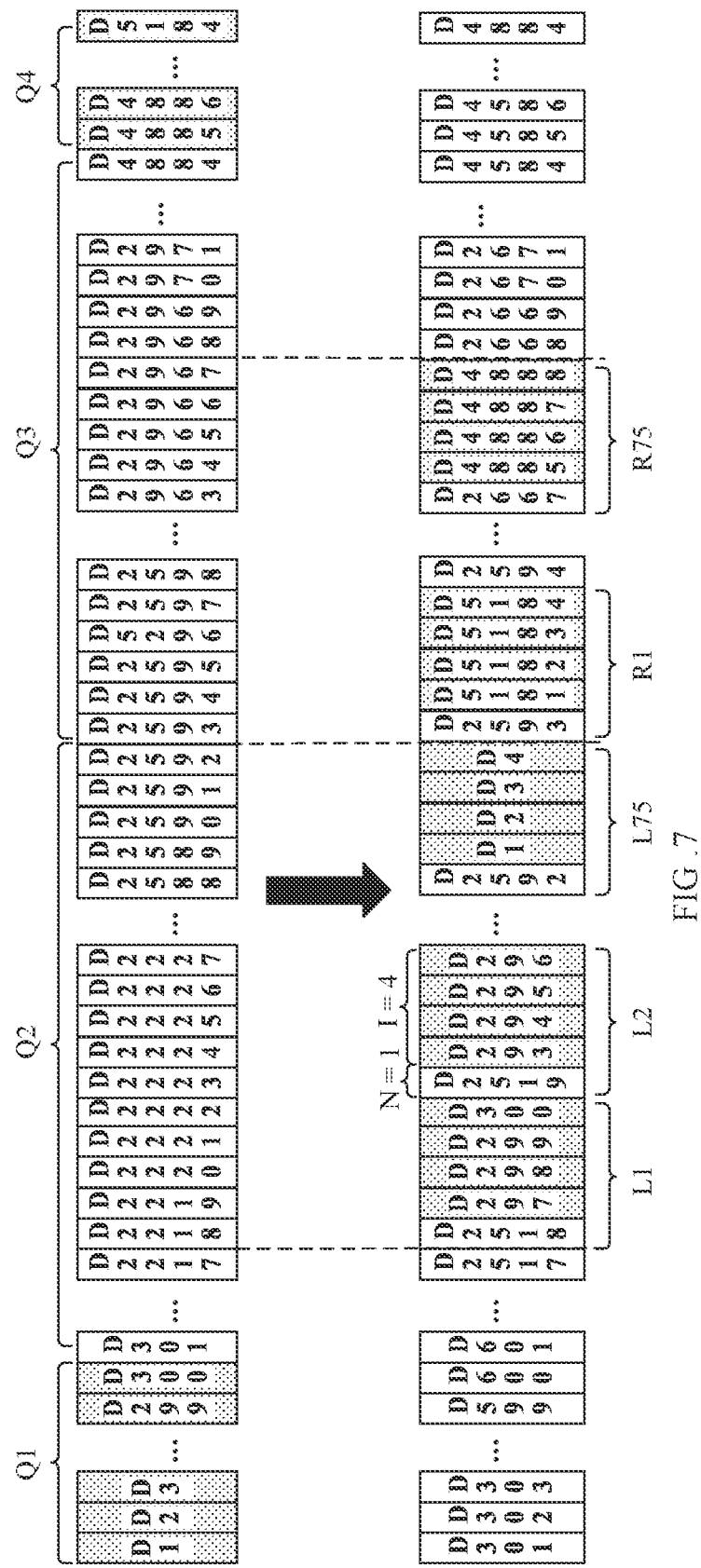
FIG. 7 is a third schematic diagram of performing sequence change processing by a drive chip according to an embodiment of this application.
Figure 9:
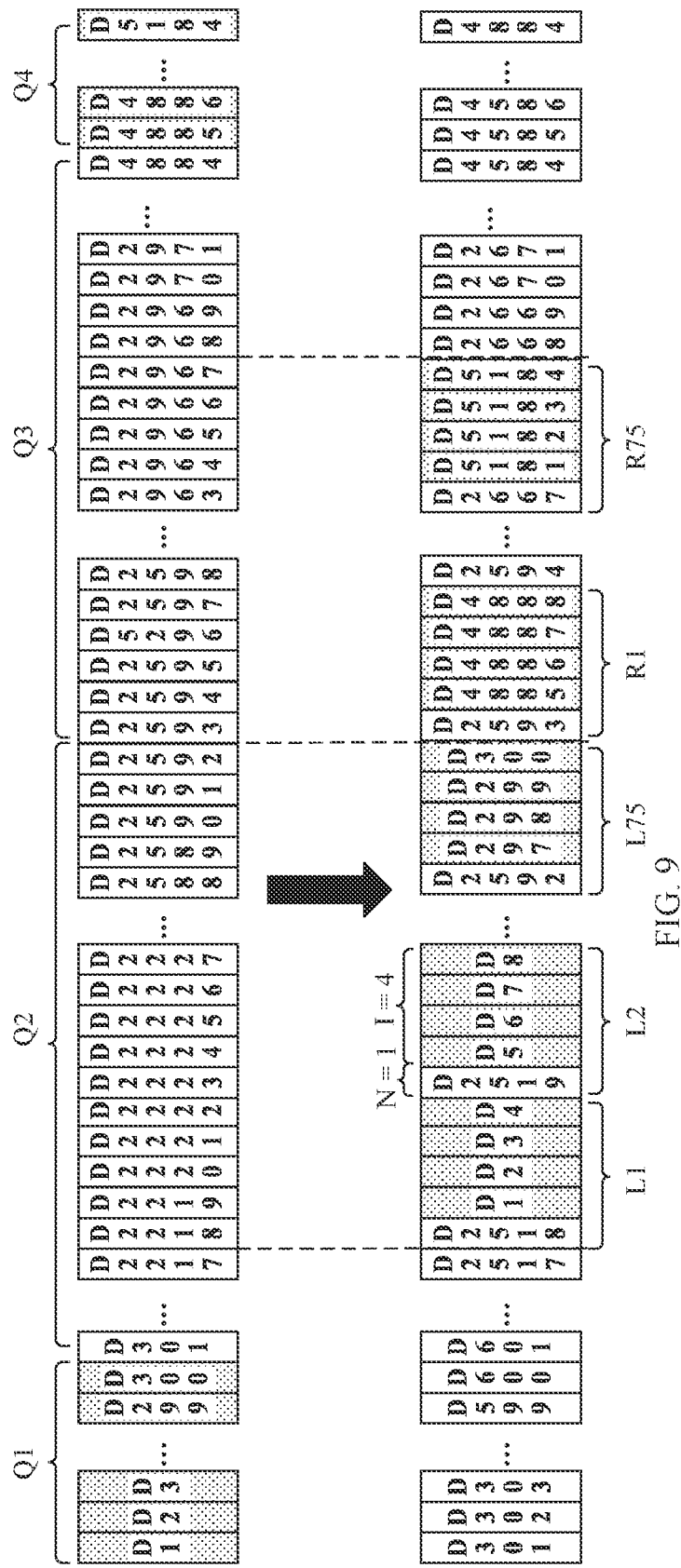
FIG. 9 is a fifth schematic diagram of performing sequence change processing by a drive chip according to an embodiment of this application.

In some other embodiments, as shown in FIG. 7 and FIG. 9, each first change data combination includes a plurality of pieces of third change data, and in the same first change data combination, a difference between an arrangement number of a signal line corresponding to an $(r+1)^{th}$ piece of third change data and an arrangement number of a signal line corresponding to an $r^{th}$ piece of third change data is 1, that is, arrangement numbers of signal lines corresponding to the third change data in each first change data combination are in ascending order. Each second change data combination includes a plurality of pieces of fifth change data, and in the same second change data combination, a difference between an arrangement number of a signal line corresponding to an $(r+1)^{th}$ piece of fifth change data and an arrangement number of a signal line corresponding to an $r^{th}$ piece of fifth change data is 1, that is, arrangement numbers of signal lines corresponding to the fifth change data in each second change data combination are in ascending order.

In one case, as shown in FIG. 7, the second change data set includes a plurality of first change data combinations, and a difference between a smallest value of arrangement numbers of signal lines corresponding to third change data in an $m^{th}$ first change data combination and a largest value of arrangement numbers of signal lines corresponding to third change data in an $(m+1)^{th}$ first change data combination is 1, that is, arrangement numbers of signal lines corresponding to the third change data included in two adjacent first change data combinations are in descending order. The third change data set includes a plurality of second change data combinations, and a difference between a smallest value of arrangement numbers of signal lines corresponding to fifth change data in an $m^{th}$ second change data combination and a largest value of arrangement numbers of signal lines corresponding to fifth change data in an $(m+1)^{th}$ second change data combination is 1, that is, arrangement numbers of signal lines corresponding to the fifth change data included in two adjacent second change data combinations are in descending order.

In this case, a difference between an arrangement number of a signal line corresponding to a $1^{st}$ piece of third change data in the $m^{th}$ first change data combination and an arrangement number of a signal line corresponding to an $I^{th}$ piece of third change data in the $(m+1)^{th}$ first change data combination is 1; and a difference between a minimum value of an arrangement number of a signal line corresponding to a $1^{st}$ piece of fifth change data in the $m^{th}$ second change data combination and a maximum value of an arrangement number of a signal line corresponding to an $I^{th}$ piece of fifth change data in the $(m+1)^{th}$ second change data combination is 1.

That is, when the first display data in the first data set Q1 is inserted, arrangement numbers of signal lines corresponding to the first display data that is in the first data set Q1 and that is inserted into each first change data combination in the second change data set are in ascending order, but arrangement numbers of signal lines corresponding to the first display data inserted into a first change data combination closer to the center position sequence number in two adjacent first change data combinations are smaller. For example, first display data inserted into a $1^{st}$ first change data combination are respectively first display data D297 of a signal line in a $297^{th}$ column, first display data D298 of a signal line in a $298^{th}$ column, first display data D299 of a signal line in a $299^{th}$ column, and first display data D300 of a signal line in a $300^{th}$ column, and first display data inserted into a $2^{nd}$ first change data combination are respectively first display data D293 of a signal line in a $293^{rd}$ column, first display data D294 of a signal line in a $294^{th}$ column, first display data D295 of a signal line in a $295^{th}$ column, and first display data D296 of a signal line in a $296^{th}$ column. When the first display data in the fourth data set Q4 is inserted, arrangement numbers of signal lines corresponding to the first display data that is in the fourth data set Q4 and that is inserted into each second change data combination in the third change data set are in ascending order, but arrangement numbers of signal lines corresponding to the first display data inserted into a second change data combination closer to the center position sequence number in two adjacent second change data combinations are larger.

In another case, as shown in FIG. 9, the second change data set includes a plurality of first change data combinations, and a difference between a smallest value of arrangement numbers of signal lines corresponding to third change data in an $(m+1)^{th}$ first change data combination and a largest value of arrangement numbers of signal lines corresponding to third change data in an $m^{th}$ first change data combination is 1, that is, arrangement numbers of signal lines corresponding to the third change data included in two adjacent first change data combinations are in ascending order. The third change data set includes a plurality of second change data combinations, and a difference between a smallest value of arrangement numbers of signal lines corresponding to fifth change data in an $(m+1)^{th}$ second change data combination and a largest value of arrangement numbers of signal lines corresponding to fifth change data in an $m^{th}$ second change data combination is 1, that is, arrangement numbers of signal lines corresponding to the fifth change data included in two adjacent second change data combinations are in ascending order.

In this case, a difference between an arrangement number of a signal line corresponding to a $1^{st}$ piece of third change data in the $(m+1)^{th}$ first change data combination and an arrangement number of a signal line corresponding to an $I^{th}$ piece of third change data in the $m^{th}$ first change data combination is 1; and a difference between an arrangement number of a signal line corresponding to a $1^{st}$ piece of fifth change data in the $(m+1)^{th}$ second change data combination and an arrangement number of a signal line corresponding to an $r^{th}$ piece of fifth change data in the $m^{th}$ second change data combination is 1.

That is, when the first display data in the first data set Q1 is inserted, the first display data may be inserted in ascending order of arrangement numbers of the signal lines corresponding to the first display data, that is, sequentially inserted. In this case, after first display data with a larger arrangement number of a signal line corresponding to the first display data in the first data set Q1 is inserted, the first display data is closer to a center position of all second display data in the second display data sequence. In this case, first display data that is in the first data set Q1 and that is inserted after the start insertion position sequence number is sequentially first display data D1 of a signal line in a first column, first display data D2 of a signal line in a second column, . . . , and first display data D300 of a signal line in a $300^{th}$ column. The first display data D300 of the signal line in the $300^{th}$ column is a $(K/2)^{th}$ piece of first display data in all pixels in this row. When the first display data in the fourth data set Q4 is inserted, the first display data may be inserted in ascending order of arrangement numbers of the signal lines corresponding to the first display data, that is, sequentially inserted. In this case, after first display data with a smaller arrangement number of a signal line corresponding to the first display data in the fourth data set Q4 is inserted, the first display data is closer to a center position of all second display data in the second display data sequence. For example, first display data that is in the fourth data set Q4 and that is inserted starting from the center position sequence number is sequentially first display data D4885 of a signal line in a $4885^{th}$ column, first display data D4886 of a signal line in a $4886^{th}$ column, . . . , and first display data D5184 of a signal line in a $5184^{th}$ column.

A difference between the second display data sequence shown in FIG. 7 to FIG. 9 and the second display data sequence shown in FIG. 5 lies in that distribution rules of the third change data in each first change data combination are different and distribution rules of the fifth change data in each second change data combination are different.

In addition, the start insertion position sequence number and the end insertion position sequence number may be symmetrically set along a center position sequence number of all display data of one row of sub-pixels, or may be asymmetrically set.

Symmetrical setting means that an amount of display data specified from the start insertion position sequence number to the center position sequence number is equal to an amount of display data specified from a next position sequence number of the center position sequence number to a previous position sequence number of the end insertion position sequence number. Asymmetric setting means that an amount of display data specified from the start insertion position sequence number to the center position sequence number is greater than or less than an amount of display data specified from a next position sequence number of the center position sequence number to a previous position sequence number of the end insertion position sequence number.

The first display data in the first data set Q1 and the first display data in the fourth data set Q4 may be inserted uniformly or non-uniformly, Uniform insertion means that amounts I of first display data that is in the first data set Q1 and that is inserted between two adjacent pieces of first display data in the second data set Q2 are equal, and amounts I of first display data that is in the fourth data set Q4 and that is inserted between two adjacent pieces of first display data in the third data set Q3 are equal. Non-uniform insertion means that amounts I of first display data that is in the first data set Q1 and that is inserted between two adjacent pieces of first display data in the second data set Q2 may also be unequal, and/or amounts I of first display data that is in the fourth data set Q4 and that is inserted between two adjacent pieces of first display data in the third data set Q3 may be unequal. For example, four pieces of first display data belonging to the first data set Q1 are inserted between two pieces of first display data in the second data set Q2, and three pieces of first display data belonging to the first data set Q1 are inserted between other two pieces of first display data in the second data set Q2.

When the first display data in the first data set Q1 and the first display data in the fourth data set Q4 are inserted, the first display data that originally belongs to the second data set Q2 and the third data set Q3 between the start insertion position sequence number and the end insertion position sequence number may be distributed uniformly or non-uniformly. Uniform distribution means that in the second display data sequence, amounts N of second change data in each first change data combination are equal, and amounts N of fourth change data in each second change data combination are equal. Non-uniform distribution means that in the second display data sequence, amounts N of second change data in two first change data combinations are not equal, and/or amounts N of fourth change data in two second change data combinations are not equal. For example, an amount N of second change data in one first change data combination is 1, and an amount N of second change data in the other first change data combination is 2.

After reordering the first display data in the first display data sequence, the sequence change module 424 sequentially writes second display data in the second display data sequence obtained after the ordering into the third buffer module 425, and then reads the second display data from the third buffer module 425 and writes the second display data into the fourth buffer module 426; and then reads the second display data from the fourth buffer module 426, and inputs the second display data to the level conversion module 427.

The third buffer module 425 and the fourth buffer module 426 in the drive chip 42 jointly form a second buffer circuit, that is, the second buffer circuit includes the third buffer module 425 and the fourth buffer module 426 that are sequentially connected.

It should be noted that a quantity of buffer modules between the sequence change module 424 and the level conversion module 427 is not limited to 2, that is, the quantity of buffer modules included in the second cache circuit is not limited to 2. When a writing speed of writing the second display data into the buffer module and a reading speed of reading the second display data from the buffer module are fast enough, a buffer module can also be disposed between the sequence change module 424 and the level conversion module 427. The quantity of buffer modules between the sequence change module 424 and the level conversion module 427 is not limited m this embodiment of this application.

In addition, when the second display data obtained after the ordering is written into the third buffer module 425, each time obtaining second display data after processing, the sequence change module 424 writes the second display data obtained after the processing into the third buffer module 425. When the third buffer module 425 buffers all second display data obtained after processing in this row, all the second display data obtained after processing in this row is written into the fourth buffer module 426, and when the second display data is read from the fourth buffer module 426, all the second display data (that is, all second display data in the second display data sequence) in this row is read.

Because the level conversion module 427 further needs to be connected to the digital-to-analog conversion module 428, and the digital-to-analog conversion module 428 has a reference voltage, the digital-to-analog conversion module 428 can recognize the second display data only when a voltage of the second display data matches the reference voltage of the digital-to-analog conversion module 428. Therefore, the level conversion module 427 performs level conversion on the input second display data, and inputs the second display data obtained through conversion to the digital-to-analog conversion module 428.

For example, it is assumed that the second display data read from the fourth buffer module 426 is data 1, and an actual data voltage corresponding to the data is 1.2 V. However, the reference voltage of the digital-to-analog conversion module 428 is 3.3 V. Therefore, the level conversion module 427 needs to convert the input second data voltage 1.2 V to 3.3 V to ensure that the digital-to-analog conversion module 428 can correctly recognize the data 1.

Because the first display data input to the drive chip 42 is a digital signal, the second display data output from the level conversion module 427 is also a digital signal. Therefore, the second display data output from the level conversion module 427 needs to be input to the digital-to-analog conversion module 428. The digital-to-analog conversion module 428 performs digital-to-analog conversion on the input second display data obtained through level conversion, and converts the second display data of the digital signal into second display data of an analog signal.

After performing digital-to-analog conversion on the second display data, the digital-to-analog conversion module 428 inputs the second display data in the form of the analog signal to the amplification module 429. The amplification module 429 performs amplification processing on the input second display data obtained through analog-to-digital conversion, and outputs the second display data (Data out) obtained through amplification processing from a pin of the drive chip 42.

The second display data output from the pin of the drive chip 42 is input to a binding terminal through a connection wire on the chip on film 43, and then transmitted to each fan-out lead 41 through the binding terminal, and each fan-out lead 41 transmits the display data to the signal line 31 connected to the fan-out lead 41.

In some embodiments, all display data of a same row of sub-pixels is output in ascending order of data defined by the pin of the drive chip 42, that is, an $i^{th}$ piece of display data in each row of sub-pixels is output from a pin i of the drive chip 42, and the pin i of the drive chip 42 is connected to an $i^{th}$ fan-out lead.

In all the display data of each row of sub-pixels, an $i^{th}$ piece of first display data in the first display data sequence is display data Di of a signal line in an $i^{th}$ column, an $i^{th}$ piece of second display data that is in the second display data sequence and that is obtained after the sequence change is display data Dj of a signal line in a $j^{th}$ column, the $i^{th}$ piece of second display data Dj in the second display data sequence is output from an $i^{th}$ pin of the drive chip 42, and then output to an $i^{th}$ fan-out lead 41, and the $i^{th}$ fan-out lead 41 is connected to the signal line 31 in the $j^{th}$ column (directly connected or connected through the connection line 33), so that the $i^{th}$ piece of second display data Dj in the second display data sequence can be correctly transmitted to the signal line 31 in the $j^{th}$ column.

After a sequence of all the first display data of each row of sub-pixels is changed, the second display data obtained after the change is output from the corresponding pin of the drive chip 42 to the fan-out lead 41 based on an arrangement result of the second display data. For example, a $1^{st}$ piece of second display data is output from a pin 1 of the drive chip 42 to a first fan-out lead 41, a $2^{nd}$ piece of second display data is output from a pin 2 of the drive chip 42 to a second fan-out lead 41, . . . , and a $5184^{th}$ piece of second display data is output from a pin 5184 of the drive chip 42 to a $5184^{th}$ fan-out lead 41.

When the display panel 20 shown in FIG. 2 and FIG. 3 is used, a first correspondence between the arrangement number of each fan-out lead 41 and the arrangement number of the signal line 31 connected to the fan-out lead 41 is the same as a second correspondence between the arrangement number of the signal line 31 corresponding to the first display data at the same position sequence number and the arrangement number of the signal line 31 corresponding to the second display data, so that the second display data obtained after the change can be transmitted to a correct signal line 31 through the fan-out lead 41.

For example, a first fan-out lead 41 is connected to a signal line 31 in a $301^{st}$ column, a second fan-out lead 41 is connected to a signal line 31 in a $302^{nd}$ column, a $2592^{nd}$ fan-out lead 41 is connected to a signal line 31 in a first column, and a $5184^{th}$ fan-out lead 41 is connected to a signal line in a $4884^{th}$ column, so that a $1^{st}$ piece of second display data D301 is output to the signal line in the $301^{st}$ column through the first fan-out lead 41, a $2^{nd}$ piece of second display data D302 is output to the signal line in the $302^{nd}$ column through the second fan-out lead 41, a $2592^{nd}$ piece of second display data D1 is output to the signal line 31 in the first column through the $2592^{nd}$ fan-out lead 41, and a $5184^{th}$ piece of second display data D4884 is output to the signal line 31 in the $4884^{th}$ column through the $5184^{th}$ fan-out lead 41.

The drive chip 42 is a display driver integrated chip (display driver IC, DDIC), and the sequence change module 424 is actually a logic circuit. When the drive chip 42 is applied to different models of terminal devices, based on a total quantity K of columns of the signal lines 31 in the display panel 20, a total quantity C of columns of the signal lines in the first edge display area 212 or the second edge display area 213, an amount I of the first display data that is in the first data set Q1 and that is inserted between every two adjacent piece of first display data in the second data set Q2, an amount I of the first display data that is in the fourth data set Q4 and that is inserted between every two adjacent pieces of first display data in the third data set Q3, and in the second display data sequence, an amount N of the first display data that is in the second data set Q2 and that exists between two adjacent pieces of first display data in the first data set Q1, and an amount N of the first display data that is in the third data set Q3 and that exists between two adjacent pieces of first display data in the fourth data set Q4, only the parameter K, the parameter C, the parameter I, and the parameter N need to be input to the drive chip 42, and the drive chip 42 executes sequence change logic (or a sequence change algorithm) of the input first display data based on the sequence change module 424 disposed in the drive chip 42, so that the drive chip 42 can input the second display data to a correct signal line 31.

It should be noted that a manner of changing the sequence of the first display data in the first display data sequence to obtain the second display data sequence that is shown in FIG. 5 to FIG. 9 needs to be used in combination with a connection relationship between the fan-out lead and the signal line connected to the fan-out lead. In embodiments of this application, the sequence change manner of the drive chip 42 is not limited to the sequence change manner shown in FIG. 5 to FIG. 9, and the sequence change manner is determined based on the first correspondence between the arrangement number of each fan-out lead 41 and the arrangement number of the signal lines 31 connected to the fan-out lead 41.

The display panel provided in embodiments of this application can be applied to a terminal device having a display function. The terminal device may be a device such as a mobile phone, a tablet computer, an electronic reader, a notebook computer, a vehicle-mounted device, a wearable device, or a television.

Figure 10:
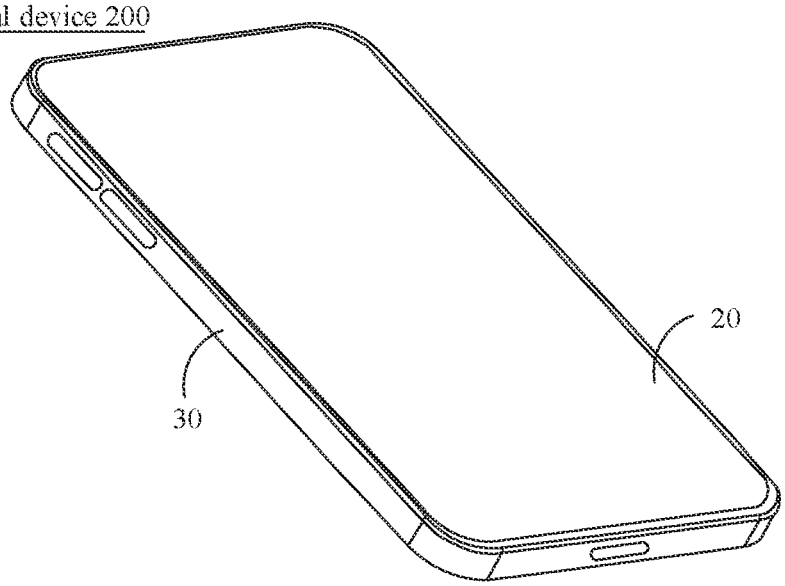
FIG. 10 is a schematic diagram of a structure of a terminal device according to an embodiment of this application.

As shown in FIG. 10, the terminal device 200 includes a display panel 20 and a housing 30. The display panel 20 is mounted on the housing 30, and is configured to display an image, a video, or the like. The display panel 20 and the housing 30 jointly enclose an accommodating cavity of the terminal device 200, to place an electronic device and the like of the terminal device 200 through the accommodating cavity, and seal and protect the electronic device located in the accommodating cavity. For example, a circuit board, a battery, and the like of the terminal device 200 are located in the accommodating cavity.

The foregoing implementations, schematic diagrams of structures, or schematic simulation diagrams are merely schematic descriptions of the technical solutions of this application, and size ratios do not constitute a limitation on the protection scope of the technical solutions. Any modification, equivalent replacement, and improvement made within the spirit and principle of the foregoing implementations shall be included within the protection scope of the technical solutions.

What is claimed is:

1. A display panel, comprising:
   a display area; and
   a bezel area surrounding the display area, the bezel area comprising:
      a binding area; and
      a fan-out area located between the binding area and the display area, the fan-out area comprising a plurality of fan-out leads disposed therein,
   wherein the display area further comprises:
      a first edge display area;
      a center display area;
      a second edge display area;
      signal lines extending along a first direction disposed in each of the first edge display area, the center display area, and the second edge display area, wherein the first edge display area, the center display area, and the second edge display area are sequentially distributed along a second direction, and wherein the first direction intersects the second direction; and
      a plurality of first connection lines and a plurality of second connection lines, wherein one end of each of the first connection lines extends to the first edge display area and the other end extends to the center display area, wherein one end of each of the second connection lines extends to the second edge display area and the other end extends to the center display area, wherein the signal lines in the first edge display area are connected to the fan-out leads through the first connection lines, wherein the signal lines in the second edge display area are connected to the fan-out leads through the second connection lines, and wherein the signal lines in the center display area are also connected to the fan-out leads,
   wherein the binding area further comprises a drive chip bound to the fan-out leads, the drive chip comprising a sequence change module circuit configured to change, based on a first correspondence between an arrangement number of each of the fan-out leads and an arrangement number of a signal line connected to a fan-out lead of the fan-out leads, a sequence of first display data in a first display data sequence corresponding to input signal lines, to obtain a second display data sequence, so as to output second display data in the second display data sequence to the fan-out leads,
   wherein there is a second correspondence between arrangement numbers of the signal lines corresponding to first display data at a same position sequence number and arrangement numbers of the signal lines corresponding to second display data,
   wherein the first correspondence is the same as the second correspondence,
   wherein the second display data in the second display data sequence is sequentially divided into a first change data set, a second change data set, a third change data set, and a fourth change data set in ascending order of position sequence numbers,
   wherein the first change data set, the second change data set, the third change data set, and the fourth change data set each comprise a plurality of pieces of second display data,
   wherein a change rule between arrangement numbers of signal lines corresponding to second display data in the first change data set is different from a change rule between arrangement numbers of signal lines corresponding to second display data in the second change data set, and wherein a change rule between arrangement numbers of signal lines corresponding to second display data in the fourth change data set is different from a change rule between arrangement numbers of signal lines corresponding to second display data in the third change data set.

2. The display panel of claim 1, wherein the second display data in the first change data set is first change data, and arrangement numbers of signal lines corresponding to the first change data are sequentially increased in ascending order of position sequence numbers of the first change data, wherein the second change data set comprises at least one first change data combination, and second display data in each first change data combination comprises second change data and third change data, wherein arrangement numbers of signal lines corresponding to the second change data are sequentially increased in ascending order of position sequence numbers of the second change data, and in the same first change data combination, arrangement numbers of signal lines corresponding to the third change data are less than the arrangement numbers of the signal lines corresponding to the second change data, wherein the second change data is second display data that is input to the signal lines in the center display area, and the third change data is second display data that is input to the signal lines in the first edge display area, wherein the third change data set comprises at least one second change data combination, and second display data in each second change data combination comprises fourth change data and fifth change data, wherein arrangement numbers of signal lines corresponding to the fourth change data are sequentially increased in ascending order of position sequence numbers of the fourth change data, and in the same second change data combination, arrangement numbers of signal lines corresponding to the fifth change data are greater than the arrangement numbers of the signal lines corresponding to the fourth change data, wherein the fourth change data is second display data that is input to the signal lines in the center display area, and the fifth change data is second display data that is input to the signal lines in the second edge display area, and wherein the second display data in the fourth change data set is sixth change data, and arrangement numbers of signal lines corresponding to the sixth change data are sequentially increased in ascending order of position sequence numbers of the sixth change data.

3. The display panel of claim 2, wherein an absolute value of a difference between arrangement numbers of signal lines corresponding to two adjacent pieces of first change data is 1, and wherein an absolute value of a difference between arrangement numbers of signal lines corresponding to two adjacent pieces of sixth change data is 1.

4. The display panel of claim 2, wherein an amount of the first change data in the first change data set is equal to an amount of the sixth change data in the fourth change data set.

5. The display panel of claim 2, wherein a quantity of first change data combinations comprised in the second change data set is equal to a quantity of second change data combinations comprised in the third change data set, wherein the first change data combinations comprise a same amount of the second change data, and the first change data combinations comprise a same amount of the third change data, wherein the second change data combinations comprise a same amount of the fourth change data, and the second change data combinations comprise a same amount of the fifth change data, and wherein an amount of the second change data comprised in the first change data combination is equal to an amount of the fourth change data comprised in the second change data combination, and an amount of the third change data comprised in the first change data combination is equal to an amount of the fifth change data comprised in the second change data combination.

6. The display panel of claim 2, wherein in the same first change data combination, a difference between an arrangement number of a signal line corresponding to the second change data and an arrangement number of a signal line corresponding to the third change data is greater than 1, and wherein in the same second change data combination, a difference between an arrangement number of a signal line corresponding to the fifth change data and an arrangement number of a signal line corresponding to the fourth change data is greater than 1.

7. The display panel of claim 2, wherein the second change data set comprises a plurality of first change data combinations, and a difference between an arrangement number of a signal line corresponding to second change data having a smallest position sequence number in an $(m+1)^{th}$ first change data combination and an arrangement number of a signal line corresponding to second change data having a largest position sequence number in an $m^{th}$ first change data combination is 1, wherein the third change data set comprises a plurality of second change data combinations, and a difference between an arrangement number of a signal line corresponding to fourth change data having a smallest position sequence number in an $(m+1)^{th}$ second change data combination and an arrangement number of a signal line corresponding to fourth change data having a largest position sequence number in an $m^{th}$ second change data combination is 1, and wherein m is a positive integer, a position sequence number of each piece of second change data in the $(m+1)^{th}$ first change data combination is greater than a position sequence number of the second change data in the $m^{th}$ first change data combination, and a position sequence number of each piece of fourth change data in the $(m+1)^{th}$ second change data combination is greater than a position sequence number of the fourth change data in the $m^{th}$ second change data combination.

8. The display panel of claim 2, wherein each first change data combination comprises a plurality of pieces of second change data, and in the same first change data combination, a difference between an arrangement number of a signal line corresponding to a $(z+1)^{th}$ piece of second change data and an arrangement number of a signal line corresponding to a $z^{th}$ piece of second change data is 1, wherein each second change data combination comprises a plurality of pieces of fourth change data, and in the same second change data combination, a difference between an arrangement number of a signal line corresponding to a $(z+1)^{th}$ piece of fourth change data and an arrangement number of a signal line corresponding to a $z^{th}$ piece of fourth change data is 1, and wherein z is a positive integer, a difference between a position sequence number of the $(z+1)^{th}$ piece of second change data and a position sequence number of the $z^{th}$ piece of second change data is 1, and a difference between a position sequence number of the $(z+1)^{th}$ piece of fourth change data and a position sequence number of the $z^{th}$ piece of fourth change data is also 1.

9. The display panel of claim 2, wherein each first change data combination comprises a plurality of pieces of third change data, and in the same first change data combination, a difference between an arrangement number of a signal line corresponding to an $r^{th}$ piece of third change data and an arrangement number of a signal line corresponding to an $(r+1)^{th}$ piece of third change data is 1, wherein each second change data combination comprises a plurality of pieces of fifth change data, and in the same second change data combination, a difference between an arrangement number of a signal line corresponding to an $r^{th}$ piece of fifth change data and an arrangement number of a signal line corresponding to an $(r+1)^{th}$ piece of fifth change data is 1, and wherein r is a positive integer, a difference between a position sequence number of the $(r+1)^{th}$ piece of third change data and a position sequence number of the $r^{th}$ piece of third change data is 1, and a difference between a position sequence number of the $(r+1)^{th}$ piece of fifth change data and a position sequence number of the $r^{th}$ piece of fifth change data is also 1.

10. The display panel of claim 9, wherein the second change data set comprises a plurality of first change data combinations, and a difference between a smallest value of arrangement numbers of signal lines corresponding to third change data in an $m^{th}$ first change data combination and a largest value of arrangement numbers of signal lines corresponding to third change data in an $(m+1)^{th}$ first change data combination is 1, wherein the third change data set comprises a plurality of second change data combinations, and a difference between a smallest value of arrangement numbers of signal lines corresponding to fifth change data in an $m^{th}$ second change data combination and a largest value of arrangement numbers of signal lines corresponding to fifth change data in an $(m+1)^{th}$ second change data combination is 1, and wherein m is a positive integer, a position sequence number of each piece of third change data in the $(m+1)^{th}$ first change data combination is greater than a position sequence number of the third change data in the $m^{th}$ first change data combination, and a position sequence number of each piece of fifth change data in the $(m+1)^{th}$ second change data combination is greater than a position sequence number of the fifth change data in the $m^{th}$ second change data combination.

11. The display panel of claim 9, wherein the second change data set comprises a plurality of first change data combinations, and a difference between a smallest value of arrangement numbers of signal lines corresponding to third change data in an $(m+1)^{th}$ first change data combination and a largest value of arrangement numbers of signal lines corresponding to third change data in an $m^{th}$ first change data combination is 1, wherein the third change data set comprises a plurality of second change data combinations, and a difference between a smallest value of arrangement numbers of signal lines corresponding to fifth change data in an $(m+1)^{th}$ second change data combination and a largest value of arrangement numbers of signal lines corresponding to fifth change data in an $m^{th}$ second change data combination is 1, and wherein m is a positive integer, a position sequence number of each piece of third change data in the $(m+1)^{th}$ first change data combination is greater than a position sequence number of the third change data in the $m^{th}$ first change data combination, and a position sequence number of each piece of fifth change data in the $(m+1)^{th}$ second change data combination is greater than a position sequence number of the fifth change data in the $m^{th}$ second change data combination.

12. The display panel of claim 2, wherein each first change data combination comprises a plurality of pieces of third change data, and in the same first change data combination, a difference between an arrangement number of a signal line corresponding to an $(r+1)^{th}$ piece of third change data and an arrangement number of a signal line corresponding to an $r^{th}$ piece of third change data is 1, wherein each second change data combination comprises a plurality of pieces of fifth change data, and in the same second change data combination, a difference between an arrangement number of a signal line corresponding to an $(r+1)^{th}$ piece of fifth change data and an arrangement number of a signal line corresponding to an $r^{th}$ piece of fifth change data is 1, and wherein r is a positive integer, a difference between a position sequence number of the $(r+1)^{th}$ piece of third change data and a position sequence number of the $r^{th}$ piece of third change data is 1, and a difference between a position sequence number of the $(r+1)^{th}$ piece of fifth change data and a position sequence number of the $r^{th}$ piece of fifth change data is also 1.

13. The display panel of claim 1, wherein the sequence change circuit comprises a logic circuit or a sequence change algorithm executed by the drive chip.

14. A display panel, comprising:
a display area; and
a bezel area surrounding the display area, the bezel area comprising:
  a binding area; and
  a fan-out area located between the binding area and the display area, the fan-out area comprising a plurality of fan-out leads disposed therein,
wherein the display area further comprises:
  a first edge display area;
  a center display area;
  a second edge display area;
  signal lines extending along a first direction disposed in each of the first edge display area, the center display area, and the second edge display area, wherein the first edge display area, the center display area, and the second edge display area are sequentially distributed along a second direction, and wherein the first direction intersects the second direction; and
  a plurality of first connection lines and a plurality of second connection lines, wherein one end of each of the first connection lines extends to the first edge display area and the other end extends to the center display area, wherein one end of each of the second connection lines extends to the second edge display area and the other end extends to the center display area, wherein the signal lines in the first edge display area are connected to the fan-out leads through the first connection lines, wherein the signal lines in the second edge display area are connected to the fan-out leads through the second connection lines, and wherein the signal lines in the center display area are also connected to the fan-out leads,
wherein the binding area further comprises a drive chip bound to the fan-out leads, the drive chip comprising:
  a sequence change circuit configured to change, based on a first correspondence between an arrangement number of each of the fan-out leads and an arrangement number of a signal line connected to a fan-out lead of the fan-out leads, a sequence of first display data in a first display data sequence corresponding to input signal lines, to obtain a second display data sequence, so as to output second display data in the second display data sequence to the fan-out leads;
  a compensation circuit configured to perform compensation processing on input initial display data to obtain first display data;
  a first buffer circuit, wherein the compensation circuit is further configured to write the first display data into the first buffer circuit, and wherein the sequence change circuit is further configured to read the first display data from the first buffer circuit;

a second buffer circuit, wherein the sequence change circuit is further configured to write the second display data obtained by changing a sequence of the first display data into the second buffer circuit;

a level conversion circuit configured to read the second display data from the second buffer circuit and perform level conversion on the second display data;

a digital-to-analog converter (DAC), wherein the level conversion circuit is further configured to input the second display data obtained through level conversion to the DAC, wherein the digital-to-analog conversion module DAC is configured to perform digital-to-analog conversion on the second display data obtained through level conversion; and an amplifier, wherein the DAC is further configured to input the second display data obtained through digital-to-analog conversion to the amplifier, wherein the amplifier is configured to perform amplification processing on the second display data obtained through digital-to-analog conversion, and output the second display data obtained through amplification processing to each of the fan-out leads, wherein an output of the compensation, circuit is provided as an input to the first buffer circuit, an output of the first buffer circuit is provided as an input to the sequence change circuit, an output of the sequence change circuit is provided as an input to the second buffer circuit, an output of the second buffer circuit is provided as an input to the level conversion circuit, an output of the level conversion circuit is provided as an input to the digital-to-DAC, and an output of the DAC is provided as an input to the amplifier, wherein there is a second correspondence between arrangement numbers of the signal lines corresponding to first display data at a same position sequence number and arrangement numbers of the signal lines corresponding to second display data, and wherein the first correspondence is the same as the second correspondence.

15. A terminal device, comprising:

a housing; and a display panel mounted on the housing, the display panel comprising:

a display area; and a bezel area surrounding the display area, the bezel area comprising:

a binding area; and a fan-out area located between the binding area and the display area, the fan-out area comprising a plurality of fan-out leads disposed therein, wherein the display area further comprises:

a first edge display area;

a center display area;

a second edge display area;

signal lines extending along a first direction disposed in each of the first edge display area, the center display area, and the second edge display area, wherein the first edge display area, the center display area, and the second edge display area are sequentially distributed along a second direction, and wherein the first direction intersects the second direction; and a plurality of first connection lines and a plurality of second connection lines, wherein one end of each of the first connection lines extends to the first edge display area and the other end extends to the center display area, wherein one end of each of the second connection lines extends to the second edge display area and the other end extends to the center display area, wherein the signal lines in the first edge display area are connected to the fan-out leads through the first connection lines, wherein the signal lines in the second edge display area are connected to the fan-out leads through the second connection lines, and wherein the signal lines in the center display area are also connected to the fan-out leads, wherein the binding area further comprises a drive chip bound to the fan-out leads, the drive chip comprising a sequence change module circuit configured to change, based on a first correspondence between an arrangement number of each of the fan-out leads and an arrangement number of a signal line connected to a fan-out lead of the fan-out leads, a sequence of first display data in a first display data sequence corresponding to input signal lines, to obtain a second display data sequence, so as to output second display data in the second display data sequence to the fan-out leads, wherein there is a second correspondence between arrangement numbers of the signal lines corresponding to first display data at a same position sequence number and arrangement numbers of the signal lines corresponding to second display data, wherein the first correspondence is the same as the second correspondence, wherein the second display data in the second display data sequence is sequentially divided into a first change data set, a second change data set, a third change data set, and a fourth change data set in ascending order of position sequence numbers, wherein the first change data set, the second change data set, the third change data set, and the fourth change data set each comprise a plurality of pieces of second display data, wherein a change rule between arrangement numbers of signal lines corresponding to second display data in the first change data set is different from a change rule between arrangement numbers of signal lines corresponding to second display data in the second change data set, and wherein a change rule between arrangement numbers of signal lines corresponding to second display data in the fourth change data set is different from a change rule between arrangement numbers of signal lines corresponding to second display data in the third change data set.

16. The terminal device of claim 15, wherein the second display data in the first change data set is first change data, and arrangement numbers of signal lines corresponding to the first change data are sequentially increased in ascending order of position sequence numbers of the first change data, wherein the second change data set comprises at least one first change data combination, and second display data in each first change data combination comprises second change data and third change data, wherein arrangement numbers of signal lines corresponding to the second change data are sequentially increased in ascending order of position sequence numbers of the second change data, and in the same first change data combination, arrangement numbers of signal lines corresponding to the third change data are less than the arrangement numbers of the signal lines corresponding to the second change data, wherein the second change data is second display data that is input to the signal lines in the center display area, and the third change data is second display data that is input to the signal lines in the first edge display area, wherein the third change data set comprises at least one second change data combination, and second display data in each second change data combination comprises fourth change data and fifth change data, wherein arrangement numbers of signal lines corresponding to the fourth change data are sequentially increased in ascending order of position sequence numbers of the fourth change data, and in the same second change data combination, arrangement numbers of signal lines corresponding to the fifth change data are greater than the arrangement numbers of the signal lines corresponding to the fourth change data, wherein the fourth change data is second display data that is input to the signal lines in the center display area, and the fifth change data is second display data that is input to the signal lines in the second edge display area, and wherein the second display data in the fourth change data set is sixth change data, and arrangement numbers of signal lines corresponding to the sixth change data are sequentially increased in ascending order of position sequence numbers of the sixth change data.

17. The terminal device of claim 16, wherein an absolute value of a difference between arrangement numbers of signal lines corresponding to two adjacent pieces of first change data is 1, and wherein an absolute value of a difference between arrangement numbers of signal lines corresponding to two adjacent pieces of sixth change data is 1.

18. The terminal device of claim 16, wherein an amount of the first change data in the first change data set is equal to an amount of the sixth change data in the fourth change data set.

19. The terminal device of claim 16, wherein a quantity of first change data combinations comprised in the second change data set is equal to a quantity of second change data combinations comprised in the third change data set, wherein the first change data combinations comprise a same amount of the second change data, and the first change data combinations comprise a same amount of the third change data, wherein the second change data combinations comprise a same amount of the fourth change data, and the second change data combinations comprise a same amount of the fifth change data, and wherein an amount of the second change data comprised in the first change data combination is equal to an amount of the fourth change data comprised in the second change data combination, and an amount of the third change data comprised in the first change data combination is equal to an amount of the fifth change data comprised in the second change data combination.

20. The terminal device of claim 15, wherein the sequence change circuit comprises a logic circuit or a sequence change algorithm executed by the drive chip.

* * * * *

UNITED STATES PATENT AND TRADEMARK OFFICE
CERTIFICATE OF CORRECTION

| | |
|---|---|
| PATENT NO. | : 12,106,698 B2 |
| APPLICATION NO. | : 17/918029 |
| DATED | : October 1, 2024 |
| INVENTOR(S) | : Yi Su, Yabin An and Haiming He |

It is certified that error appears in the above-identified patent and that said Letters Patent is hereby corrected as shown below:

In the Claims

Claim 14, Column 45, Lines 13-14: "wherein the digital-to-analog conversion module DAC is" should read "wherein the DAC is"

Claim 14, Column 45, Line 33: "input to the digital-to-DAC, and" should read "input to the DAC, and"

Signed and Sealed this
Nineteenth Day of November, 2024

Katherine Kelly Vidal
*Director of the United States Patent and Trademark Office*